(12) United States Patent
Park et al.

(10) Patent No.: US 11,094,708 B2
(45) Date of Patent: Aug. 17, 2021

(54) VERTICAL-TYPE MEMORY DEVICE

(71) Applicant: Samsung Electronics Co., Ltd., Suwon-si (KR)

(72) Inventors: Joo Won Park, Seoul (KR); Kyeong Jin Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/378,625

(22) Filed: Apr. 9, 2019

(65) Prior Publication Data

US 2020/0098786 A1 Mar. 26, 2020

(30) Foreign Application Priority Data

Sep. 21, 2018 (KR) .................. 10-2018-0114033

(51) Int. Cl.
*H01L 27/11582* (2017.01)
*H01L 27/11565* (2017.01)
(Continued)

(52) U.S. Cl.
CPC ...... *H01L 27/11582* (2013.01); *H01L 23/481* (2013.01); *H01L 27/11565* (2013.01);
(Continued)

(58) Field of Classification Search
CPC ............ H01L 27/11582; H01L 23/481; H01L 27/11556; H01L 27/1157; H01L 27/11524; H01L 29/40117; H01L 27/11573
See application file for complete search history.

(56) References Cited

U.S. PATENT DOCUMENTS 9,006,884 B2 * 4/2015 Lee .................. H01L 27/11575
257/734
9,305,830 B2 4/2016 Park et al.
(Continued)

FOREIGN PATENT DOCUMENTS

KR 10-2012-0136764 A 12/2012

OTHER PUBLICATIONS

Office Action dated Nov. 19, 2020 from the Indian Patent Office for Corresponding Indian Patent No. 201944020662.

*Primary Examiner* — Khaja Ahmad
*Assistant Examiner* — Khatib A Rahman
(74) *Attorney, Agent, or Firm* — Muir Patent Law, PLLC

(57) ABSTRACT

A vertical-type memory device includes a plurality of gate electrode layers spaced apart from one another and stacked on a substrate, and extending by different lengths in a first direction and forming a staircase structure, a first interlayer insulating layer covering the staircase structure of the plurality of gate electrode layers, and a plurality of gate contact plugs penetrating the interlayer insulating layer and respectively in contact with the gate electrode layers. The plurality of gate electrode layers include lower gate electrode layers disposed adjacently to the substrate, and upper gate electrode layers disposed on the lower gate electrode layers, so that the lower gate electrodes are between the substrate and the upper gate electrode layers. The plurality of gate contact plugs include lower gate contact plugs connected to the lower gate electrode layers, and upper gate contact plugs connected to the upper gate electrode layers. The upper gate contact plugs have top-most portions disposed at a height higher than a height of top surfaces of the lower gate contact plugs.

19 Claims, 20 Drawing Sheets

(51) Int. Cl.
  *H01L 27/11573*   (2017.01)
  *H01L 29/423*    (2006.01)
  *H01L 23/48*     (2006.01)
  *H01L 21/28*     (2006.01)
  *H01L 27/11526*   (2017.01)
  *H01L 27/11556*   (2017.01)
  *H01L 27/11519*   (2017.01)

(52) U.S. Cl.
  CPC .. *H01L 27/11573* (2013.01); *H01L 29/40117* (2019.08); *H01L 29/4234* (2013.01); *H01L 27/11519* (2013.01); *H01L 27/11526* (2013.01); *H01L 27/11556* (2013.01)

(56) References Cited

U.S. PATENT DOCUMENTS

| | | | |
|---|---|---|---|
| 9,412,753 B2 | 8/2016 | Izumi et al. | |
| 9,419,013 B1* | 8/2016 | Lee | H01L 23/535 |
| 9,524,901 B2 | 12/2016 | Izumi et al. | |
| 9,524,983 B2 | 12/2016 | Lee et al. | |
| 9,601,577 B1* | 3/2017 | Lee | H01L 21/823462 |
| 9,698,158 B2* | 7/2017 | Jung | H01L 27/11575 |
| 9,899,394 B2 | 2/2018 | Hwang et al. | |
| 9,905,572 B2* | 2/2018 | Lee | H01L 27/11582 |
| 9,953,993 B2 | 4/2018 | Utsumi et al. | |
| 10,026,611 B2* | 7/2018 | Lee | H01L 27/11573 |
| 10,790,358 B2* | 9/2020 | Choi | H01L 29/1037 |
| 10,818,728 B2* | 10/2020 | Park | H01L 27/11575 |
| 2009/0230462 A1* | 9/2009 | Tanaka | H01L 27/11578 257/326 |
| 2015/0372000 A1* | 12/2015 | Jee | H01L 27/11521 257/314 |
| 2016/0079259 A1* | 3/2016 | Son | H01L 23/528 257/401 |
| 2016/0225714 A1* | 8/2016 | Yun | H01L 27/11582 |
| 2016/0268291 A1* | 9/2016 | Ishimura | H01L 27/11582 |
| 2017/0170191 A1* | 6/2017 | Lee | H01L 27/11582 |
| 2017/0229577 A1* | 8/2017 | Matsuura | H01L 27/11565 |
| 2017/0256558 A1* | 9/2017 | Zhang | H01L 27/1207 |
| 2017/0373087 A1* | 12/2017 | Ito | H01L 27/11573 |
| 2018/0358374 A1* | 12/2018 | Kim | H01L 27/1157 |
| 2019/0035804 A1* | 1/2019 | Kim | H01L 23/5226 |
| 2019/0035808 A1* | 1/2019 | Hwang | H01L 27/11573 |
| 2020/0105735 A1* | 4/2020 | Park | H01L 27/11556 |
| 2020/0194454 A1* | 6/2020 | Zhang | H01L 27/11573 |

* cited by examiner

VERTICAL-TYPE MEMORY DEVICE

CROSS-REFERENCE TO RELATED APPLICATION(S)

This application claims priority to Korean Patent Application No. 10-2018-0114033 filed on Sep. 21, 2018 in the Korean Intellectual Property Office, the disclosure of which is herein incorporated by reference in its entirety.

BACKGROUND

1. Field

Example embodiments of the present inventive concept relate to a vertical-type memory device.

2. Description of Related Art

Electronic products have consistently been reduced in size and designed to process high capacity data. Accordingly, it has been helpful to increase integration density of a semiconductor memory device used in electronic products. To increase integration density of a semiconductor memory device, a vertical-type memory device in which memory cells having a vertical-type transistor structure, rather than a general planar transistor structure, are stacked has been developed.

SUMMARY

According to an example embodiment of the present inventive concept, a vertical-type memory device includes a plurality of gate electrode layers spaced apart from one another and stacked on a substrate, and extending by different lengths in a first direction and forming a staircase structure, a first interlayer insulating layer covering the staircase structure of the plurality of gate electrode layers, and a plurality of gate contact plugs penetrating the interlayer insulating layer and respectively in contact with the gate electrode layers. The plurality of gate electrode layers include lower gate electrode layers disposed adjacently to the substrate, and upper gate electrode layers disposed on the lower gate electrode layers, so that the lower gate electrodes are between the substrate and the upper gate electrode layers. The plurality of gate contact plugs include lower gate contact plugs connected to the lower gate electrode layers, and upper gate contact plugs connected to the upper gate electrode layers. The upper gate contact plugs have top-most portions disposed at a height higher than a height of top surfaces of the lower gate contact plugs.

According to an example embodiment of the present inventive concept, which may include the features of the above example embodiment, a vertical-type memory device includes a memory cell region including a plurality of gate electrode layers spaced apart from one another and vertically stacked on the substrate, and a plurality of gate contact plugs respectively contacting the plurality of gate electrode layers. The plurality of gate contact plugs include a first gate contact plug contacting a lowermost gate electrode layer among the plurality of gate electrode layers, and a second gate contact plug contacting an uppermost gate electrode layer among the plurality of gate electrode layers, and the first gate contact plug has a top surface having a first height lower than a second height of a top-most surface of the second gate contact plug. The first gate contact plug is integrally formed of a continuous material to extend from the lowermost gate electrode layer to a height above the uppermost gate electrode layer, and the second gate contact plug is integrally formed of a continuous material to extend from the uppermost gate electrode layer to the second height.

According to an example embodiment of the present inventive concept, which may include the features of the above example embodiments, a vertical-type memory device includes a lower substrate, circuit devices provided on the lower substrate, a lower interlayer insulating layer covering the circuit devices, an upper substrate disposed on the lower interlayer insulating layer, a first gate electrode layer and a second gate electrode layer spaced apart from each other and stacked on the upper substrate, an upper interlayer insulating layer covering the first gate electrode layer and the second gate electrode layer, a first gate contact plug and a second gate contact plug penetrating through the upper interlayer insulating layer and respectively contacting the first gate electrode layer and the second gate electrode layer, and a through plug penetrating through the first and second gate electrode layers and the upper substrate and electrically connected to the circuit devices. The first gate contact plug and the through plug have top surfaces having heights lower than a height of a top-most portion of the second gate contact plug.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows with reference to the accompanied drawings.

Figure 1:
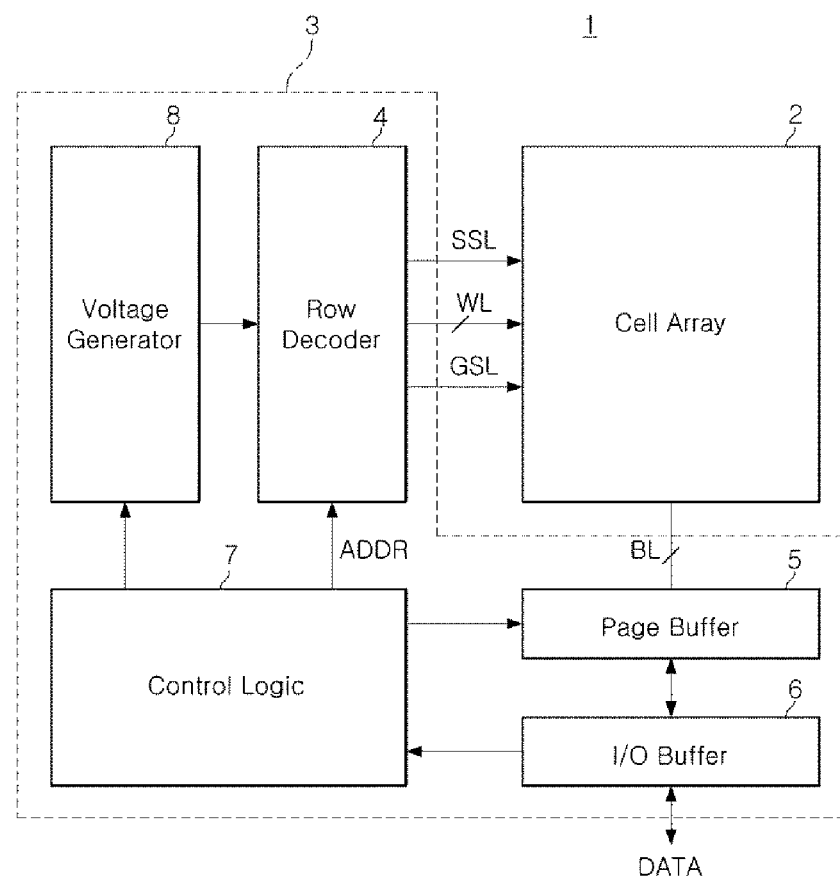
FIG. 1 is a schematic block diagram illustrating a semiconductor device according to an example embodiment of the present inventive concept.

FIG. 1 is a schematic block diagram illustrating a semiconductor device according to an example embodiment. As described herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may include memory devices such as volatile or non-volatile memory devices.

Referring to FIG. 1, a semiconductor device 1 may include a memory cell array 2 and a peripheral circuit 3. The peripheral circuit 3 may include a row decoder 4, a page buffer 5, an input and output buffer 6, a control logic 7, and a voltage generator 8.

The memory cell array 2 may include a plurality of memory blocks, and each of the memory blocks may include a plurality of memory cells. The plurality of memory cells may be connected to the row decoder 4 through a string selection line SSL, word lines WL, and a ground selection line GSL, and may be connected to the page buffer 5 through bit lines BL. In the example embodiments, a plurality of memory cells arranged in the same row may be connected to the same word line WL, and the plurality of memory cells arranged in the same column may be connected to the same bit line BL.

The row decoder 4 may decode an input address ADDR, and may generate and transfer driving signals of the word line WL. The row decoder 4 may provide a word line voltage generated by the voltage generator 8 to selected word lines WL and non-selected word lines WL in response to a control of the control logic 7.

The page buffer 5 may be connected to the memory cell array 2 through the bit line BL, and may read out information stored in the memory cells. The page buffer 5 may temporarily store data to be stored in the memory cells or may sense data stored in the memory cells depending on operational modes. The page buffer 5 may include a column decoder and a sense amplifier. The column decoder may selectively activate the bit lines BL of the memory cell array 2, and the sense amplifier may sense a voltage of the bit line BL selected by the column decoder and read out data stored in the selected memory cell during a reading operation.

Once a program operates, the input and output buffer 6 may receive data DATA and transfer the data DATA to the page buffer 5, and during a reading operation, the input and output buffer 6 may output the data DATA transferred from the page buffer 5 to an external entity. The input and output buffer 6 may transfer an input address or an input command to the control logic 7.

The control logic 7 may control operations of the row decoder 4 and the page buffer 5. The control logic 7 may receive a control signal and an external voltage transferred from an external entity, and may operate in response to the received control signal. The control logic 7 may control a reading operation, a writing operation, and/or an erasing operation in response to the control signals.

The voltage generator 8 may generate voltages for internal operations, such as a programming voltage, a reading voltage, an erasing voltage, and the like, using an external voltage. The voltage generated by the voltage generator 8 may be transferred to the memory cell array 2 through the row decoder 4.

Figure 2:
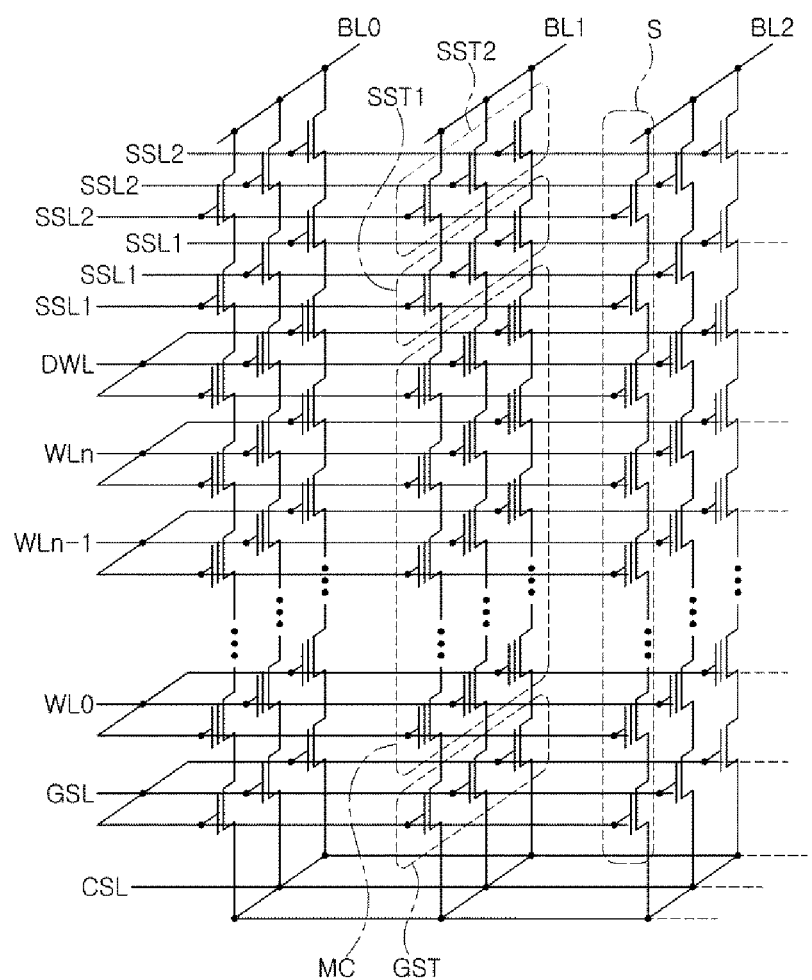
FIG. 2 is a diagram illustrating an equivalent circuit of a cell array of a semiconductor device according to an example embodiment of the present inventive concept.

FIG. 2 is a diagram illustrating an equivalent circuit of a cell array of a semiconductor device according to an example embodiment.

Referring to FIG. 2, a memory cell array 2 may include memory cells MC connected to each other in series, a ground selection transistor GST connected to both ends of the memory cells MC in series, and a plurality of memory cell strings S including string selection transistors SST1 and SST2. The plurality of memory cell strings S may respectively be connected to bit lines BL0 to BL2 in parallel. The plurality of memory cell strings S may be connected to a common source line CSL in common. For example, the plurality of memory cell strings S may be disposed between the plurality of bit lines BL0 to BL2 and a single common source line CSL. In an example embodiment, the common source line CSL is configured such that a plurality of the common source lines CSL are arranged two-dimensionally.

The memory cells MC, connected to each other in series, may be controlled by word lines WL0 to WLn for selecting the memory cells MC. Each of the memory cells MC may include a data storage factor. Gate electrodes of the memory cells MC disposed the same distance from the common source line CSL may be connected to one of the word lines WL0 to WLn in common, and may be in an equipotential state. Alternatively, even when the gate electrodes of the memory cells MC are disposed the same distance from the common source lines CSL, gate electrodes disposed in different rows or columns may be controlled independently.

The ground selection transistor GST may be controlled by a ground selection line GSL, and may be connected to the common source line CSL. The string selection transistor SST may be controlled by string selection lines SSL1 and SSL2, and may be connected to the bit lines BL0 to BL2. FIG. 2 illustrates the example in which a single ground selection transistor GST and two string selection transistors SST1 and SST2 are connected to each of the plurality of memory cells MC connected to each other in series, but an example embodiment thereof is not limited thereto. A single string selection transistor SST1 and SST2 may be connected to each of the plurality of memory cells MC, or a plurality of ground selection transistors GST may be connected to the plurality of memory cells MC. One or more dummy lines DWL or buffer lines may be disposed between a highest word line WLn among the word lines WL0 to WLn and string selection lines SSL1 and SSL2. In the example embodiment, one or more dummy lines DWL may be also disposed between a lowest word line WLn and the ground selection line GSL.

Once a signal is applied to the string selection transistors SST1 and SST2 via the string selection lines SSL1 and SSL2, a signal applied via the bit lines BL0 to BL2 may be transferred to the memory cells MC connected to each other in series, and an operation of reading out data and an operation of writing data may be performed accordingly. Also, by applying an erasing voltage through a substrate, an operation of erasing data recorded in the memory cells MC may be performed. In an example embodiment, the memory cell array 2 may include at least one dummy memory cell string electrically isolated from the bit lines BL0 to BL2.

Figure 3:
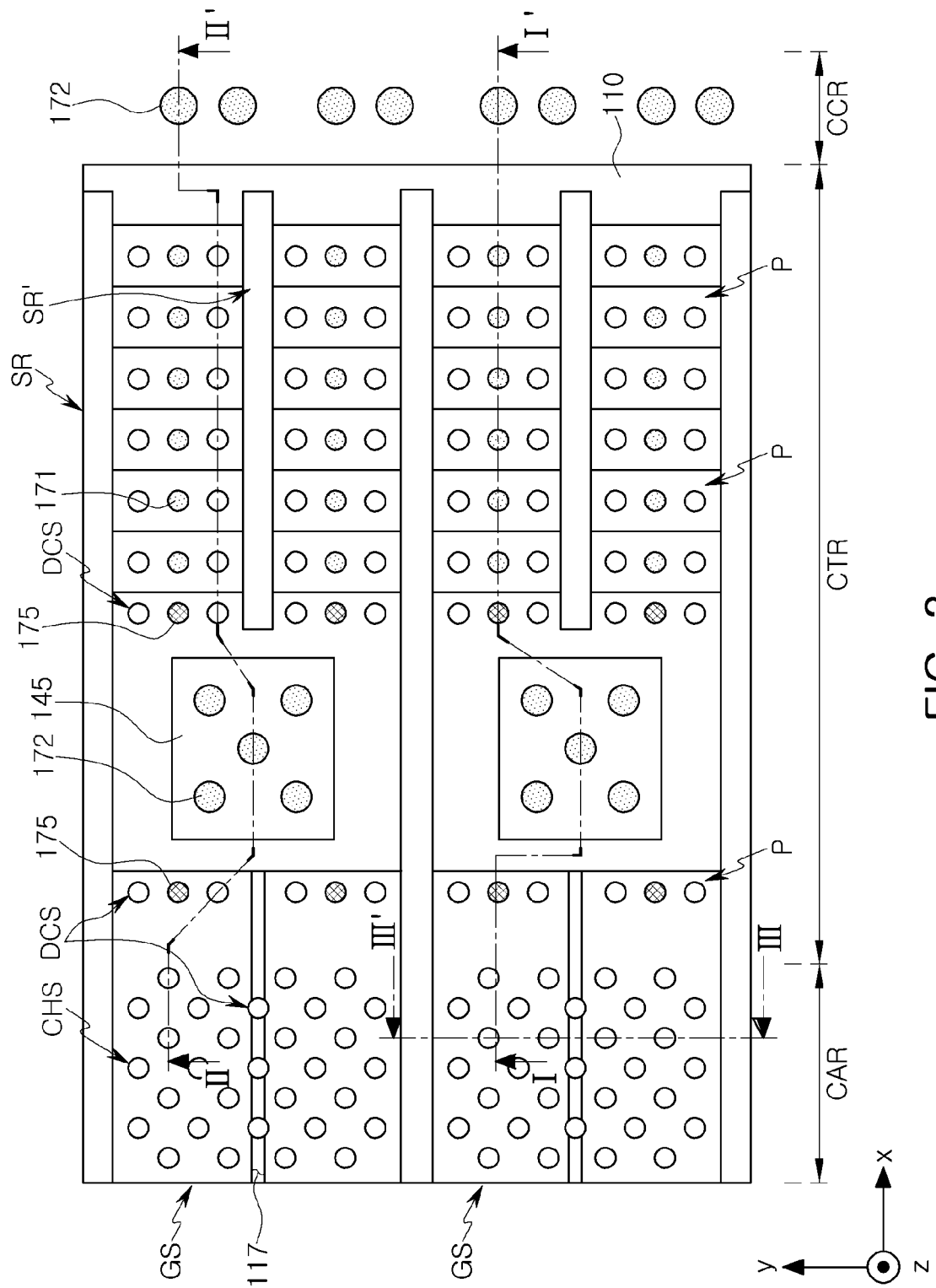
FIG. 3 is a schematic plan diagram illustrating a semiconductor device according to an example embodiment of the present inventive concept.
Figure 4:
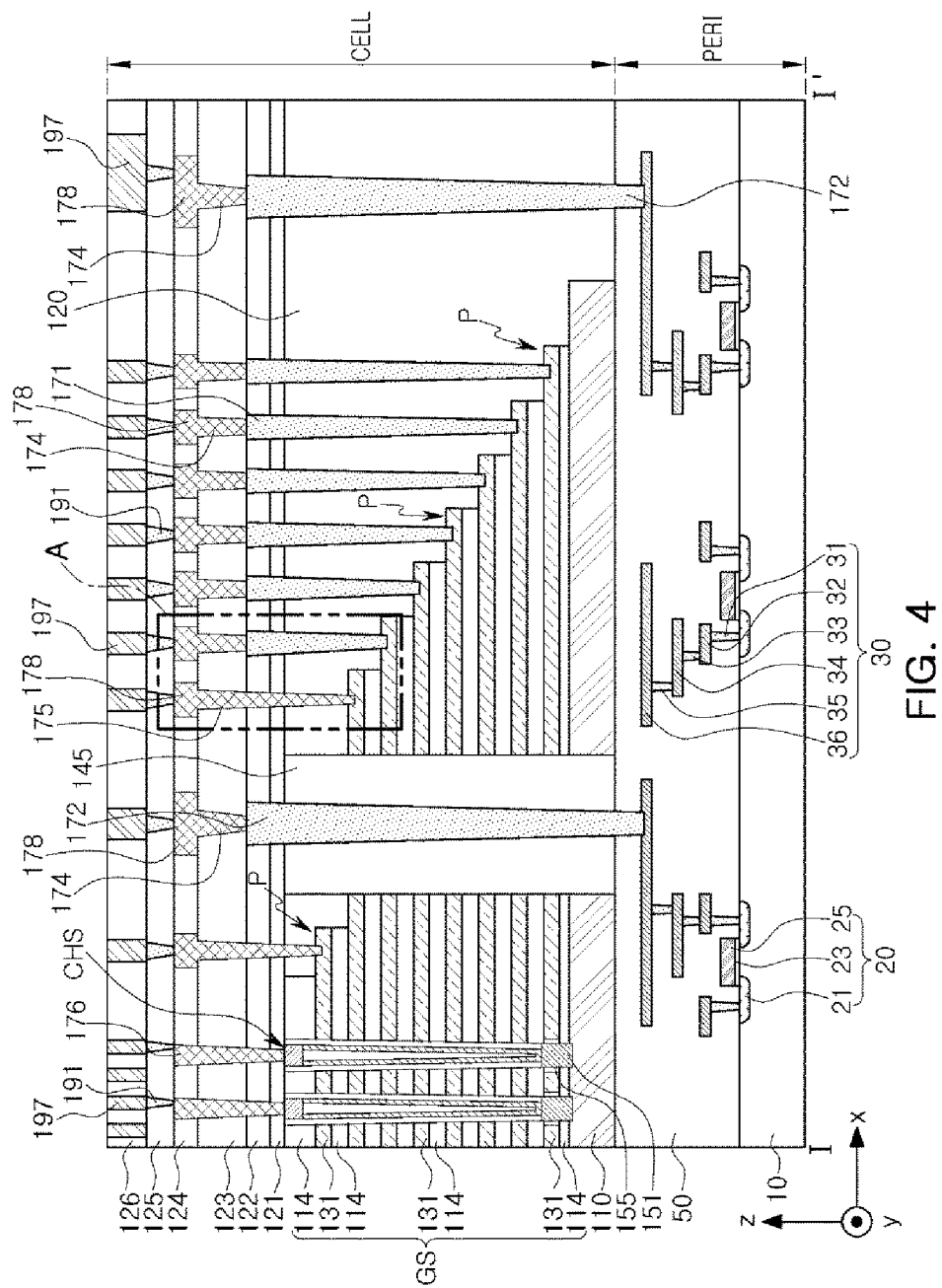
FIG. 4 is a schematic cross-sectional diagram illustrating a semiconductor device, taken along line I-I' in FIG. 3, according to an example embodiment of the present inventive concept.
Figure 5:
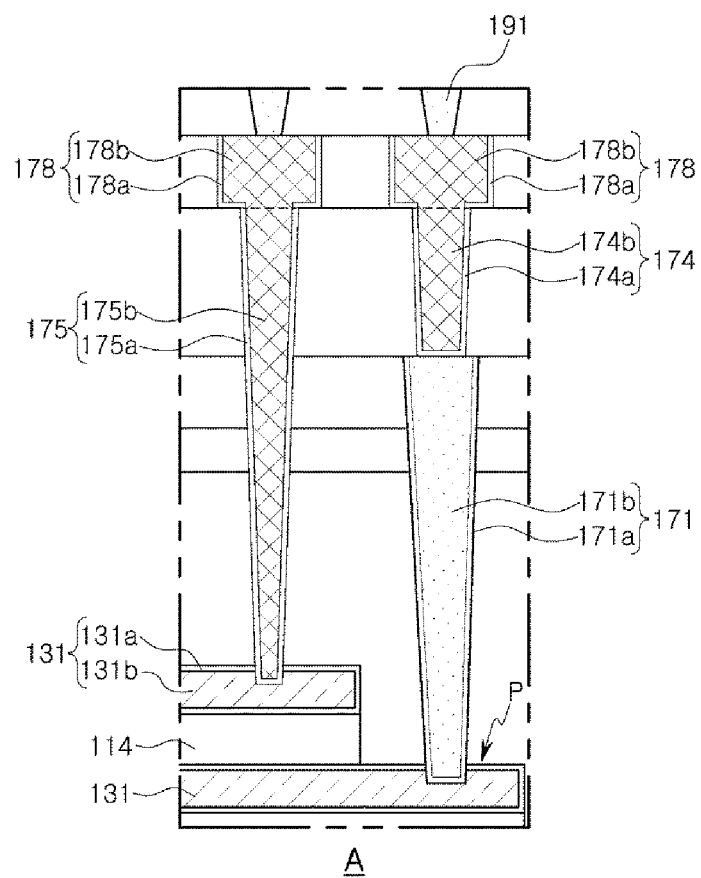
FIG. 5 is a cross-sectional diagram illustrating region "A" in FIG. 4 in magnified form.
Figure 6:
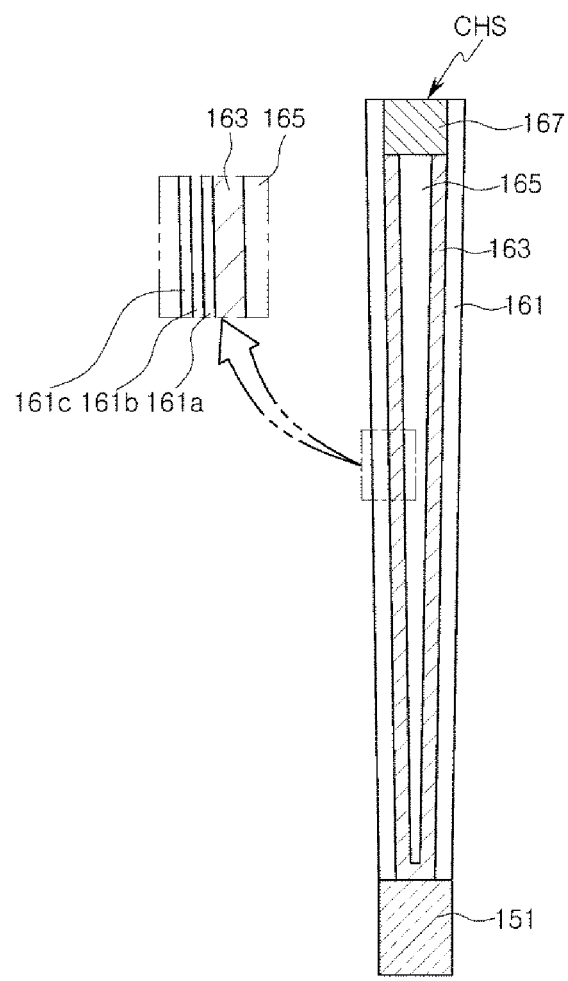
FIG. 6 is a diagram illustrating a channel structure (CHS) in FIG. 4.
Figure 7:
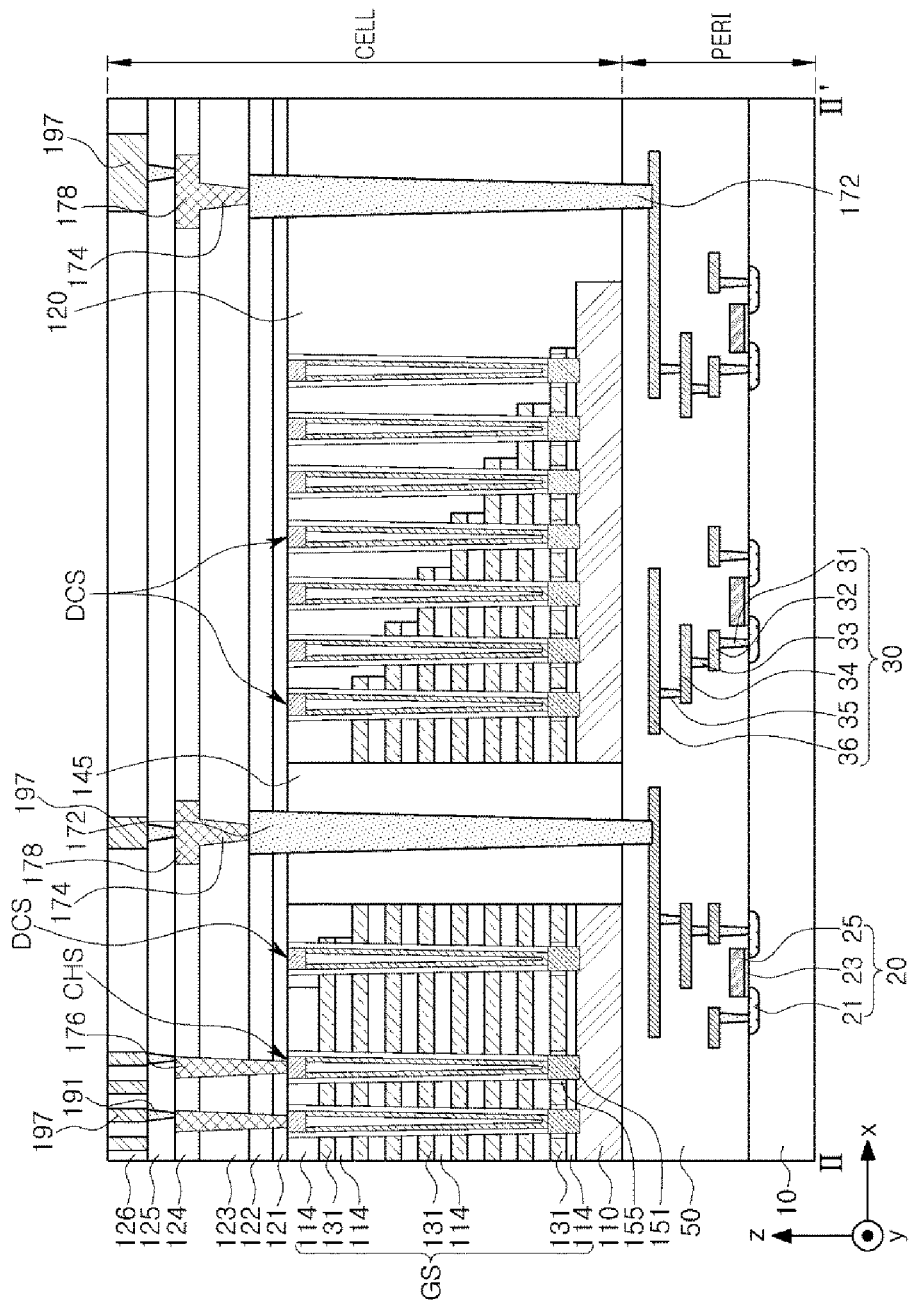
FIG. 7 is a schematic cross-sectional diagram illustrating a semiconductor device, taken along line II-II' in FIG. 3, according to an example embodiment of the present inventive concept.
Figure 8:
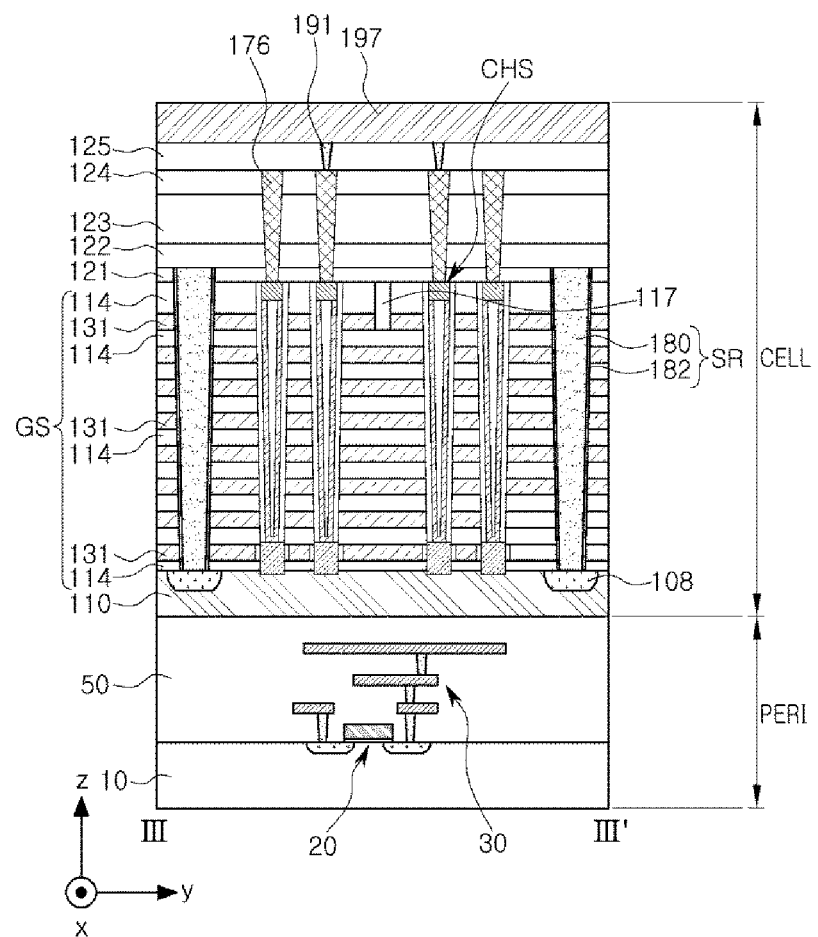
FIG. 8 is a schematic cross-sectional diagram illustrating a semiconductor device, taken along line III-III' in FIG. 3, according to an example embodiment of the present inventive concept.

FIG. 3 is a schematic plan diagram illustrating a semiconductor device according to an example embodiment. FIG. 4 is a cross-sectional diagram taken along line I-I' in FIG. 3. FIG. 5 is a cross-sectional diagram illustrating region "A" in FIG. 4 in magnified form. FIG. 6 is a diagram illustrating a channel structure (CHS) in FIG. 4. FIG. 7 is a cross-sectional diagram taken along line in FIG. 3. FIG. 8 is a cross-sectional taken along line in FIG. 3.

Referring to FIGS. 3 to 6, a semiconductor device 100 may include a lower substrate 10, and upper substrates 110 disposed on the lower substrate 10. A peripheral circuit region PERI may be disposed on the lower substrate 10, and memory cell regions CELL may be disposed on the upper substrates 110.

The peripheral circuit region PERI may include the lower substrate 10, circuit devices 20 disposed on the lower substrate 10, a lower interlayer insulating layer 50 covering the circuit devices 20, and a lower wiring structure 30.

The lower substrate 10 may have a top surface extending in an X direction and a Y direction. The lower substrate 10 may include a semiconductor material, such as a group IV semiconductor, a group III-V compound semiconductor, or a group II-VI compound semiconductor. For example, the group IV semiconductor may include silicon, germanium, or silicon-germanium. The lower substrate 10 may be provided as a bulk wafer or an epitaxial layer. The lower substrate 10 may include a well region including impurities and device isolation regions.

The circuit devices 20 may include a circuit gate dielectric layer 23, a circuit gate electrode layer 25, and a source/drain region 21. The circuit gate dielectric layer 23 may include, for example, silicon oxide, an insulating material with a high dielectric constant, or compounds thereof. The insulating material with a high dielectric constant may have a dielectric constant higher than a dielectric constant of silicon oxide. The circuit gate electrode layer 25 may include a conductive material such as a metal, polycrystalline silicon and metal silicide. The source/drain region 21 may be doped with n-type impurities or p-type impurities. A spacer disposed on both side walls of the circuit gate electrode layer 25 may be further included, and the spacer may be formed of silicon nitride, for example.

The lower interlayer insulating layer 50 may cover the lower substrate 10, and the circuit devices 20 on the lower substrate 10, and may be disposed between the lower substrate 10 and the upper substrates 110. The lower interlayer insulating layer 50 may be formed of an insulating material.

The lower wiring structure 30 may include a first lower contact plug 31, a first lower wiring line 32, a second lower contact plug 33, a second lower wiring line 34, a third lower contact plug 35, and a third lower wiring line 36, sequentially stacked from the source/drain region 21. The number of wiring lines forming the lower wiring structure 30 may vary in example embodiments. The lower wiring structure 30 may include a metal, such as tungsten (W), copper (Cu), aluminum (Al), and the like, for example.

The memory cell region CELL may include the upper substrate 110, gate electrode layers 131 spaced apart from each other and vertically stacked on a top surface of the upper substrate 110, mold insulating layers 114 alternately stacked with the gate electrode layers 131, channel structures CHS and dummy structures DCS disposed to penetrate through the gate electrode layers 131, first to seventh upper interlayer insulating layers 120, 121, 122, 123, 124, 125, and 126 covering the gate electrode layers 131, first and second gate contact plugs 171 and 175 connected to the gate electrode layers 131, first contact studs 174 connected to the first gate contact plugs 171, channel contact studs 176 connected to the channel structures CHS, and through plugs 172 connected to the lower wiring structure 30. The gate electrode layers 131 and the mold insulating layers 114 alternately stacked may form a gate stack structure GS. As described herein, contact plugs are continuously formed, integral pillar-shaped structures (e.g., extending vertically and formed of a continuous material). The contact plugs described herein extend upward from an internal conductive line (e.g., a word line or gate electrode layer 131, or a wiring line). Thus, the contact plugs have a bottom termination portion that contacts an internal conductive line. The contact plugs described herein that pass through insulating layers of the cell region CELL pass through at least two interlayer insulating layers. The conductive plugs that extend upward from pad regions P of gate electrode layers 131 extend continuously upward beyond a top-most gate electrode layer 131, and may extend further beyond a top-most mold insulating layer 114 and beyond at least one of upper interlayer insulating layers 121 and 122. Components that extend upward vertically from another vertical structure such as a channel structure CHS, a contact plug, or another contact stud which may be integrally formed with a upper wiring, are referred to herein as contact studs. Therefore, contact studs have a bottom termination portion that does not contact an internal word line, gate electrode layer, or wiring line. Also, within the cell region CELL, contact studs described herein may be formed above the first upper interlayer insulating layer 120.

The upper substrate 110 may have top surfaces extending in an X direction and a Y direction. The upper substrate 110 may have a size smaller than a size of the lower substrate 10. The upper substrate 110 may include a semiconductor material, such as a group IV semiconductor, for example. The upper substrate 110 may be formed as a polycrystalline silicon layer, for example, but embodiments of the upper substrate 110 are not limited thereto. The upper substrate 110 and the lower substrate 10 may be formed of a different material in relation to each other, or of a different crystalline structure. The lower substrate 10 may include at least one well region including impurities. For example, an entire region of the lower substrate 10 may be a single p-well region.

The gate electrode layers 131 may be spaced apart from each other and vertically stacked on the upper substrates 110, and may extend by different lengths in at least one direction, in an X direction, for example. An uppermost gate electrode layer 131 may have the shortest length, and a lowermost gate electrode layer 131 may have the longest length. In some embodiments, the further the gate electrode layer 131 is disposed from the upper substrate 110, the shorter the length of the gate electrode layer 131. The gate electrode layers 131 may provide pad regions P forming a staircase structure in a connection region CTR. The gate electrode layers 131 may be a ground selection line of ground selection transistors, a word line of memory cells, and a string selection line of string selection transistors in the semiconductor device 100, respectively. For example, the lowermost gate electrode layer 131 may be a ground selection line, and the uppermost gate electrode layer 131 may be a string selection line. The rest of the gate electrode layers 131, other than the uppermost and lowermost gate electrode layers 131, may be word lines. The number of the gate electrode layers 131 may vary depending on data storage capacity of the semiconductor device 100. The gate electrode layers 131 may include a conductive layer formed of a metal material (e.g., tungsten (W)), for example. In an example embodiment, the gate electrode layers 131 may include a conductive layer formed of polycrystalline silicon or metal silicide. In an example embodiment, the gate electrode layers 131 may further include a barrier layer encapsulating the conductive layer. The barrier layer may include tungsten nitride (WN), tantalum nitride (TaN), titanium nitride (TiN), or compounds thereof, for example.

The mold insulating layers 114 may be disposed between the gate electrode layers 131. The mold insulating layers 114 may be spaced apart from each other in a Z direction, perpendicular to a top surface of the upper substrates 110, and may extend by different lengths in an X direction similarly to the gate electrode layers 131. The mold insulating layers 114 may include an insulating material such as silicon oxide or silicon nitride.

The channel structures CHS may be spaced apart from each other and form columns and rows on the upper substrate 110 in a cell array region CAR. The channel structures CHS may be disposed in a grid pattern, or disposed in zigzag lines in one direction, on an X-Y planar surface. The channel structures CHS may have a columnar shape, and may have an inclined side surface. The channel structures CHS may have a diameter or a width narrowing towards the upper substrate 110. The dummy structures DCS may be disposed in a straight line to overlap with a string separation insulating layer 117 in a cell array region CAR. The dummy structures DCS may be disposed adjacently to the gate contact plugs 171 and 175 in the connection region CTR as well. The dummy structures DCS disposed in the connection region CTR may penetrate through at least one gate electrode layer 131. The dummy structures DCS may have a structure that is same as or similar to a structure of the channel structures CHS. The dummy structures DCS may be ineffective in storing data, or may store data that is ignored by a memory controller. For example, in some embodiments, in contrast to the channel structures CHS which connects to bit lines, the dummy structures DCS may not connect to bit lines. Or, in some embodiments, even if dummy structures DCS are connected to bit lines, any data stored in the dummy structures DCS is ignored or not used by a memory controller. The dummy structures DCS may alternatively be referred to as dummy channel structures, while non-dummy, channel structures CHS may be referred to as working channel structures.

The channel structures CHS will be described in greater detail with reference to FIG. 6. Each of the channel structures CHS may include an epitaxial layer 151, a gate dielectric layer 161, a channel region 163, a channel insulating layer 165, and a channel pad 167. The channel region 163 may be configured to encapsulate the internally disposed channel insulating layer 165. In other words, the channel insulating layer 165 may fill an internal space of the channel region 163. In an example embodiment, the channel region 163 may have a columnar shape such as a cylinder or a prism. The epitaxial layer 151 may be disposed between the channel region 163 and the upper substrate 110 in lower portions of the channel structures CHS. The epitaxial layer 151 may be disposed at least in part in a recessed area of the upper substrate 110. The epitaxial layer 151 may contact a lower end of the channel region 163 and electrically connected to the channel region 163. As used herein, the term "contact" refers to a direct physical connection (e.g., touching). A height of a top surface of the epitaxial layer 151 may be higher than a height of a top surface of the lowermost gate electrode layer 131, and may be lower than a height of a bottom surface of the gate electrode layer 131 disposed immediately above the lowermost gate electrode layer 131. In an example embodiment, the epitaxial layer 151 may be omitted, and in this case, the channel region 163 may directly contact the upper substrate 110 in order to be electrically connected to the upper substrate 110. The channel pads 167 may contact an upper end of the channel region 163 and may be electrically connected to the channel region 163. The channel insulating layer 165 may include, for example, silicon oxide. The epitaxial layer 151 and the channel region 163 may include a semiconductor material such as polycrystalline silicon or single crystal silicon. The semiconductor material may be a non-doped material, or may be doped with p-type impurities or n-type impurities. The channel pads 167 may include doped polycrystalline silicon, for example. The gate dielectric layer 161 may be disposed between the gate electrode layers 131 and the channel region 163. The gate dielectric layer 161 may encapsulate the channel region 163. The gate dielectric layer 161 may include a tunneling layer 161a, an electric charge storing layer 161b, and a blocking layer 161c, sequentially stacked from the channel region 163. The tunneling layer 161a may include silicon oxide ($SiO_2$), silicon nitride ($Si_3N_4$), silicon oxynitride (SiON), or compounds thereof, for example. The electric charge storing layer 161b may be an electric charge trap layer or a floating conductive layer. The electric charge trap layer may include silicon nitride. The floating conductive layer may include polycrystalline silicon. The blocking layer 161c may include silicon oxide ($SiO_2$), silicon nitride ($Si_3N_4$), silicon oxynitride (SiON), a high-k dielectric material, or compounds thereof.

An epi-insulating layer 155 may be disposed between the epitaxial layer 151 and the lowermost gate electrode layer 131. The epi-insulating layer 155 may have a ring shape surrounding the epitaxial layer 151.

A first upper interlayer insulating layer 120 may be disposed to cover the upper substrate 110 and the gate electrode layers 131 on the upper substrate 110. A top surface of the first upper interlayer insulating layer 120 may be coplanar with a top surface of an uppermost mold insulating layer 114. Second to seventh upper interlayer insulating layers 121, 122, 123, 124, 125, and 126 may be stacked on the uppermost mold insulating layer 114 and the first upper interlayer insulating layer 120. The first to seventh upper interlayer insulating layers 120, 121, 122, 123, 124, 125, and 126 may include silicon oxide or a low-k dielectric material.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The memory cell regions CELL in the semiconductor device 100 may further include a through region 145 penetrating through the gate electrode layers 131, the mold insulating layers 114, and the upper substrate 110 and extending to an upper portion of the lower interlayer insulating layer 50 in the connection region CTR. A height of a bottom surface of the through region 145 may be lower than a height of a bottom surface of the upper substrate 110, or may be at the same height as a bottom surface of the upper substrate 110. The through region 145 may have an inclined side wall (not shown), and have a width narrowing toward a lower portion. For example, a width of a bottom surface of the through region 145 may be narrower than a width of a top surface thereof, and a width of an upper portion of the through region 145 may be greater than a width of a lower portion thereof. The through region may pass through a portion of the stack of gate electrode layers 131 and mold insulating layers 114 to be surrounded on its sidewall surfaces by side surfaces of the gate electrode layers 131 and mold insulating layers 114. The through region 145 may also be described as a through structure, which includes a vertical insulating structure.

The through region 145 may include an insulating material, and the through plugs 172 may penetrate through the through region 145 and may be connected to the lower wiring structure 30. The through plugs 172 may also be disposed in a core region CCR adjacent to the connection region CTR, and may penetrate through the first upper interlayer insulating layer 120 and may be connected to a lower wiring structure 30. The through plugs 172 may be electrically connected to circuit devices 20 through the lower wiring structure 30. The through plugs 172 may also penetrate through the second and third upper interlayer insulating layers 121 and 122 covering the through region 145.

The gate contact plugs 171 and 175 may be connected to pad regions P provided by the gate electrode layers 131. Some of the plurality of gate electrode layers 131, disposed in an upper portion, may be referred to as upper gate electrode layers 131, and the gate electrode layers 131 below the upper gate electrode layers 131 may be referred to as lower gate electrode layers 131. The plurality of gate electrode layers 131 may include the lower gate electrode layers 131 disposed adjacently to the upper substrate 110, and the upper gate electrode layers 131 disposed on the lower gate electrode layers 131. The first gate contact plugs 171 may penetrate through the first, second, and third upper interlayer insulating layers 120, 121, and 122 and may contact the pad regions P of the lower gate electrode layers 131. The second gate contact plugs 175 may penetrate through the first to fourth upper interlayer insulating layers 120, 121, 122, and 123 and may contact the upper gate electrode layers 131. The first gate contact plugs 171 may be referred to as lower contact plugs, and the second gate contact plugs 175 may be referred to as upper contact plugs. A top or top surface of the second gate contact plugs 175 (e.g., where it meets first upper wirings 178) may have a height higher than a height a top of the first gate contact plugs 171. The top or top surface of the second gate contact plugs 175 may have a height higher than a height of top surfaces of the through plugs 172.

The first contact studs 174 may penetrate through the fourth upper interlayer insulating layer 123 and may contact upper ends and an upper surface of the first gate contact plugs 171. The channel contact studs 176 may penetrate through the second to fifth upper interlayer insulating layers 121, 122, 123, and 124 and may contact upper portions of the channel structures CHS. The channel contact studs 176 may contact the channel pads 167 of the channel structures CHS. Top surfaces of the channel contact studs 176 may be disposed at a height higher than a height of top surfaces of the first contact studs 174 (e.g., higher than a top-most portion of the first contact studs 174 where they meet the first upper wirings 178). Top surfaces of the channel contact studs 176 may be disposed at a height higher than top surfaces of the second gate contact plugs 175 (e.g., higher than a top-most portion of the second gate contact plugs 175 where they meet the first upper wirings 178). Top surfaces of the channel contact studs 176 may be disposed at a height equal to top surfaces of first upper wirings 178.

The first upper wirings 178 may include a conductive material, described as metal wires, disposed on the first contact studs 174 and the second contact plugs 175. Thus, first metal wires may be respectively disposed on the first contact studs 174, and second metal wires may be respectively disposed on the second contact plugs 175. The first upper wirings 178 may penetrate through the fifth interlayer insulating layer 124 and may be directly connected to the first contact studs 174 and the second contact plugs 175. Through a dual damascene process, some of the first upper wirings 178 may respectively be integrated with the first contact studs 174 (e.g., to form a continuous, integral structure). Also, through a dual damascene process, the other first upper wirings 178 may respectively be integrated with the second gate contact plugs 175. On the first upper wirings 178, second contact studs 191 penetrating through the sixth upper interlayer insulating layer 125 and connected to the first upper wirings 178 may be disposed. On the second contact studs 191, second upper wirings 197 penetrating through the seventh upper interlayer insulating layer 126 may be disposed. At least some of the second upper wirings 197 may be connected to the second contact studs 191.

Referring to FIG. 5, the gate electrode layers 131 may include a gate barrier layer 131a and a gate conductive layer 131b. The gate barrier layer 131a may encapsulate the gate conductive layer 131b. The gate barrier layer 131a may be formed of a conductive metal nitride, such as tungsten nitride (WN), tantalum nitride (TaN), titanium nitride (TiN), or compounds thereof. The gate conductive layer 131b may be formed of a metal material, such as tungsten, for example. The first gate contact plugs 171 may include a first gate contact barrier layer 171a and a first gate contact conductive layer 171b, and a bottom surface and a side surface of the first gate contact conductive layer 171b may be encapsulated by the first gate contact barrier layer 171a. The first gate contact barrier layer 171a may have a structure in which titanium (Ti) and titanium nitride (TiN) are stacked, for example. The first gate contact conductive layer 171b may be formed of a metal material, such as tungsten, for example. The first upper wiring 178 may be disposed on the second gate contact plugs 175, and the second gate contact plugs 175 and the first upper wire 178 may be integrated with each other through a dual damascene process. The second gate contact plugs 175 may include a second gate contact barrier layer 175a and a second gate contact conductive layer 175b, and a bottom surface and a side surface of the second gate contact conductive layer 175b may be encapsulated by the second gate contact barrier layer 175a. The first upper wiring 178 may include a first upper wiring barrier layer 178a and a first upper wiring conductive layer 178b, a portion of a bottom surface and a side surface of the first upper wiring conductive layer 178b may be encapsulated by the first upper wiring barrier layer 178a. The second gate contact conductive layer 175b and the first upper wiring conductive layer 178b may be integrated with each other through a single deposition process. The second gate contact barrier layer 175a and the first upper wiring barrier layer 178a may be integrated with each other through a single deposition process.

The first upper wiring 178 may be disposed on the first contact stud 174, and the first contact stud 174 and the first upper wiring 178 may be integrated with each other through a dual damascene process. The first contact stud 174 may include a first contact stud barrier layer 174a and a first contact stud conductive layer 174b, and a bottom surface and a side surface of the first contact stud conductive layer 174b may be encapsulated by the first contact stud barrier layer 174a. The first upper wiring 178 may include the first upper wiring barrier layer 178a and the first upper wiring conductive layer 178b, and a portion of a bottom surface and a side surface of the first upper wiring conductive layer 178b may be encapsulated by the first upper wiring barrier layer 178a. The first contact stud conductive layer 174b and the first upper wiring conductive layer 178b may be integrated with each other through a single deposition process. The first contact stud barrier layer 174a and the first upper wiring barrier layer 178a may be integrated with each other through a single deposition process.

The first gate contact plugs 171 and the second gate contact plugs 175 may be inserted into the pad region P of the gate electrode layers 131.

The semiconductor device 100 may further include separation regions SR dividing the gate electrode layers 131 in the memory cell regions CELL into a plurality of regions spaced apart from each other in a Y direction, and extending in an X direction. The separation region SR may include a conductive layer 180 and an insulating layer 182, and the conductive layer 180 may be a common source line. The conductive layer 180 may be electrically insulated from the gate electrode layers 131 by the insulating layer 182. The separation regions SR may be connected to impurity regions 108 disposed in an upper portion of the upper substrate 110. In the memory cell regions CELL, the string separation insulating layer 117 dividing the uppermost gate electrode layer 131 disposed between the separation regions SR into two regions spaced apart from each other, and extending in an X direction may be disposed. The string separation insulating layer 117 may include an insulating material such as silicon oxide. An auxiliary separation regions SR' may be disposed between the separation regions SR. The auxiliary separation regions SR' may be spaced apart from the string separation insulating layer 117 in an X direction, and may be disposed in a straight line. The auxiliary separation regions SR' may extend by a length shorter than a length of the separation regions SR in an X direction. The auxiliary separation regions SR' may have the same structure as a structure of the separation regions SR, and may be connected to the upper substrate 110.

Figure 9:
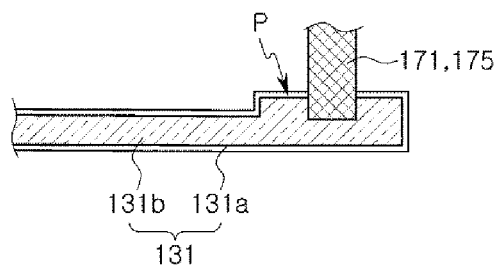
FIG. 9 is a cross-sectional diagram illustrating a pad region of a semiconductor device according to an example embodiment of the present inventive concept.

FIG. 9 is a cross-sectional diagram illustrating a pad region of a semiconductor device according to an example embodiment.

Referring to FIG. 9, pad regions P of the gate electrode layers 131 may have a thickness greater than thicknesses of the other regions of the gate electrode layers 131. The pad regions P may prevent a punching defect in which gate contact holes penetrate through the pad regions P during a process of etching the gate contact holes.

Figure 10:
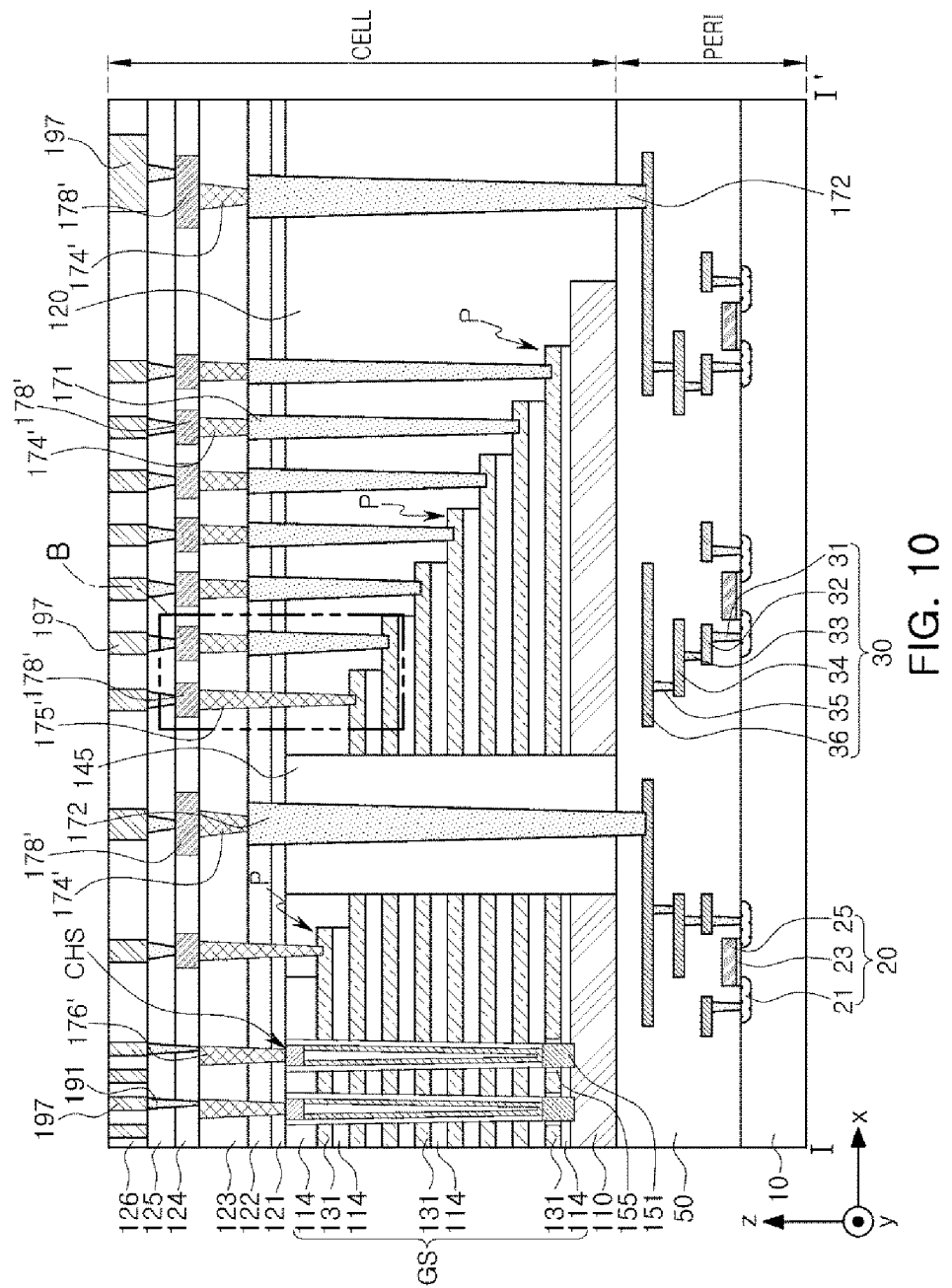
FIG. 10 is a schematic cross-sectional diagram illustrating a semiconductor device, corresponding to FIG. 4, according to an example embodiment of the present inventive concept.
Figure 11:
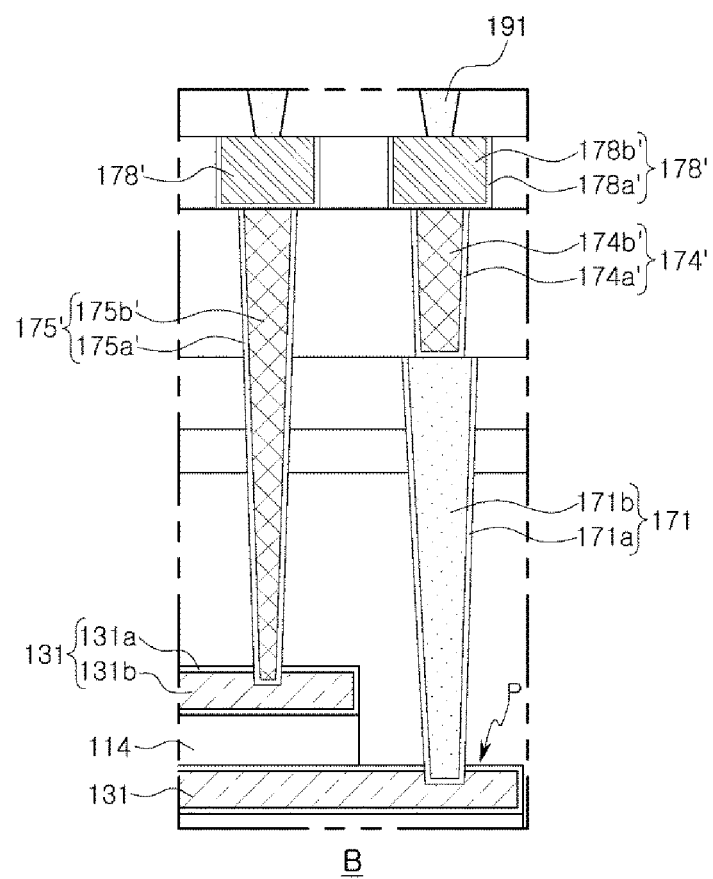
FIG. 11 is a cross-sectional diagram illustrating region "A" in FIG. 10 in magnified form.

FIG. 10 is a schematic cross-sectional diagram illustrating a semiconductor device, corresponding to FIG. 4, according to an example embodiment. FIG. 11 is a cross-sectional diagram illustrating region "A" in FIG. 10 in magnified form. In the semiconductor device in FIGS. 3 to 8, the first upper wirings 178 and the first contact studs 174 may be integrated with each other, and the first upper wirings 178 and second gate contact plugs 175 may be integrated with each other, through a damascene process. Differently from the semiconductor device in FIGS. 3 to 8, in a semiconductor device in FIGS. 10 and 11, first contact studs 174', second gate contact plugs 175', and channel contact studs 176' may be formed through a single damascene process, and then first upper wirings 178' may be formed through a single damascene process. The semiconductor device in FIGS. 10 and 11 may be similar to the semiconductor device in FIGS. 3 to 8, and thus, overlapping descriptions will not be repeated.

Referring to FIG. 10, top surfaces of the channel contact studs 176' may be disposed at a height equal to a height of top surfaces of the first contact studs 174'. Top surfaces of the channel contact studs 176' may be disposed at the same height as a height of top surfaces of the second gate contact plugs 175'.

Referring to FIG. 11, the second gate contact plugs 175' may include a second gate contact barrier layer 175a' and a second gate contact conductive layer 175b', and a bottom surface and a side surface of the second gate contact conductive layer 175b' may be encapsulated by the second gate contact barrier layer 175a'. The first upper wirings 178' may include the first upper wiring barrier layer 178a' and the first upper wiring conductive layer 178b', and a bottom surface and a side surface of the first upper wiring conductive layer 178b' may be encapsulated by the first upper wiring barrier layer 178a'. The second gate contact conductive layer 175b' may contact the first upper wiring barrier layer 178a'. The first contact studs 174' may include a first contact stud barrier layer 174a' and a first contact stud conductive layer 174b', and a bottom surface and a side surface of the first contact stud conductive layer 174b' may be encapsulated by the first contact stud barrier layer 174a'. The first contact stud conductive layer 174b' may contact the first upper wiring barrier layer 178a'.

Figure 12:
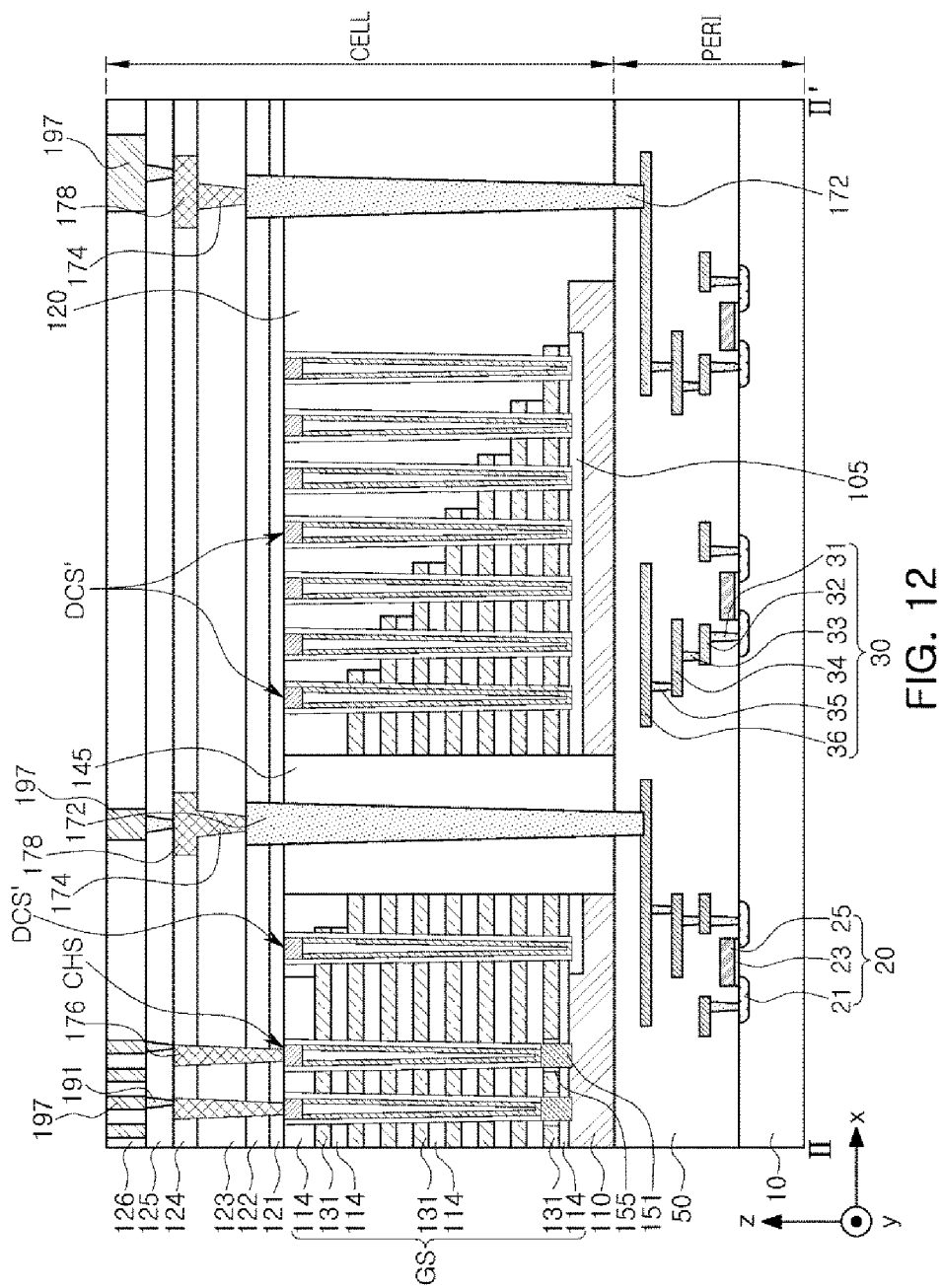
FIG. 12 is a schematic cross-sectional diagram illustrating a semiconductor device, corresponding to FIG. 7, according to an example embodiment of the present inventive concept.

FIG. 12 is a schematic cross-sectional diagram illustrating a semiconductor device, corresponding to FIG. 7, according to an example embodiment.

In the semiconductor device in FIG. 12, differently from the semiconductor device in FIGS. 3 to 8, a structure of dummy structures DCS' may be different from a structure of channel structures CHS. An upper substrate 110 may include an insulating layer 105, and the dummy structures DCS' may be disposed on the insulating layer 105. The channel structures CHS may be electrically connected to the upper substrate 110, and the dummy structures DCS' may be electrically insulated from the substrate 110. The dummy structures DCS' may thus be electrically floated. The dummy structures DCS' may not include an epitaxial layer 151, differently from the channel structures CHS.

Figure 13:
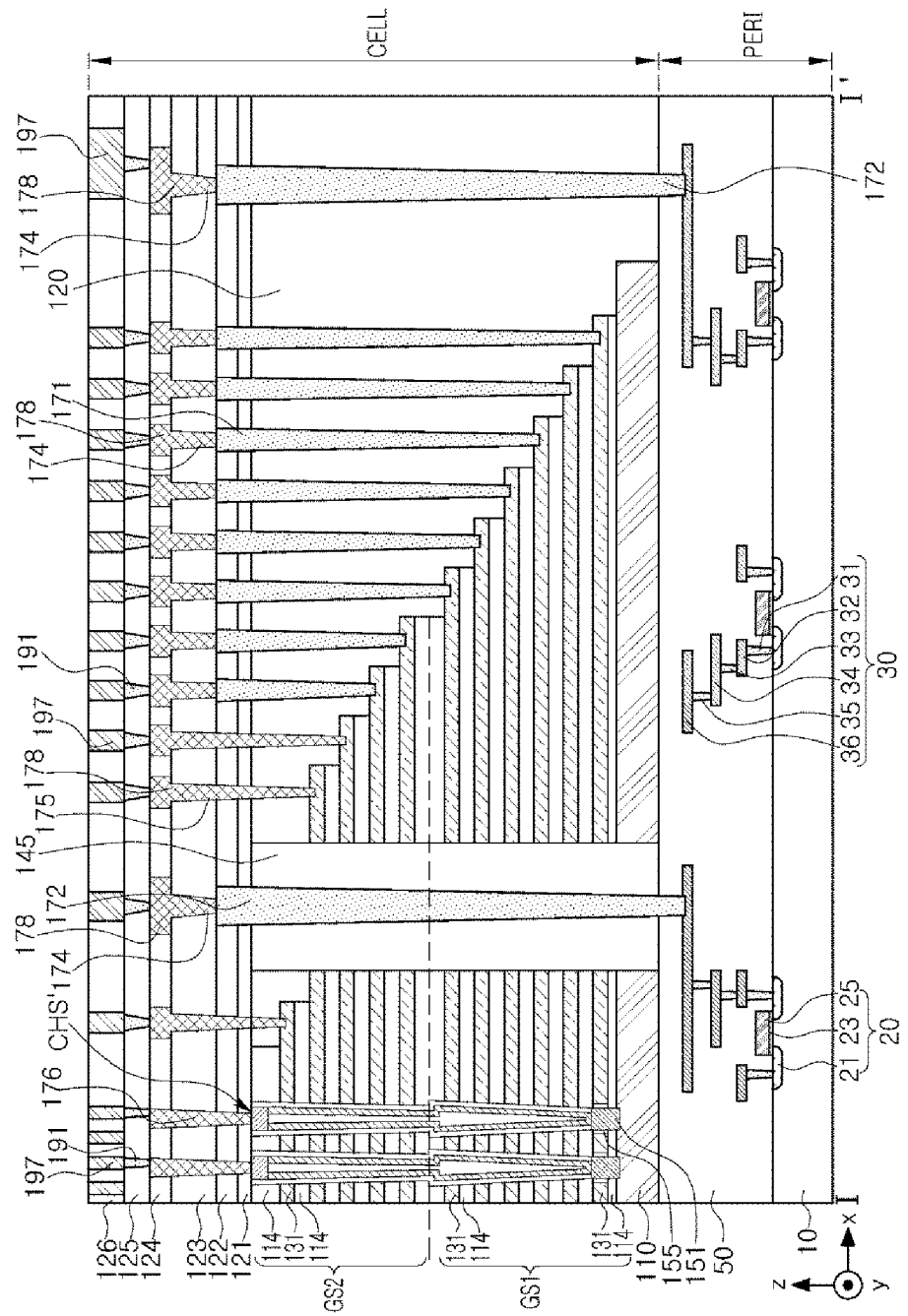
FIG. 13 is a schematic cross-sectional diagram illustrating a semiconductor device according to an example embodiment of the present inventive concept.

FIG. 13 is a schematic cross-sectional diagram illustrating a semiconductor device according to an example embodiment.

Referring to FIG. 13, the semiconductor device may include a first gate stack structure GS1 and a second gate stack structure GS2, sequentially stacked on an upper substrate 110. The first gate stack structure GS1 and the second gate stack structure GS2 may include alternately disposed mold insulating layers 114 and gate electrode layers 131. Channel structures CHS' may penetrate through the first and second gate stack structures GS1 and GS2 and may contact the upper substrate 110. The channel structures CHS' may have a width abruptly changing at a boundary between the first gate stack structure GS1 and the second gate stack structure GS2. The channel structures CHS' may include a region having a width decreasing towards the upper substrate 110, which width then abruptly increases. A width of the channel structures CHS' may decrease towards the upper substrate 110 and abruptly increase at a boundary between the first gate stack structure GS1 and the second gate stack structure GS2, and may decrease again.

Figure 14:
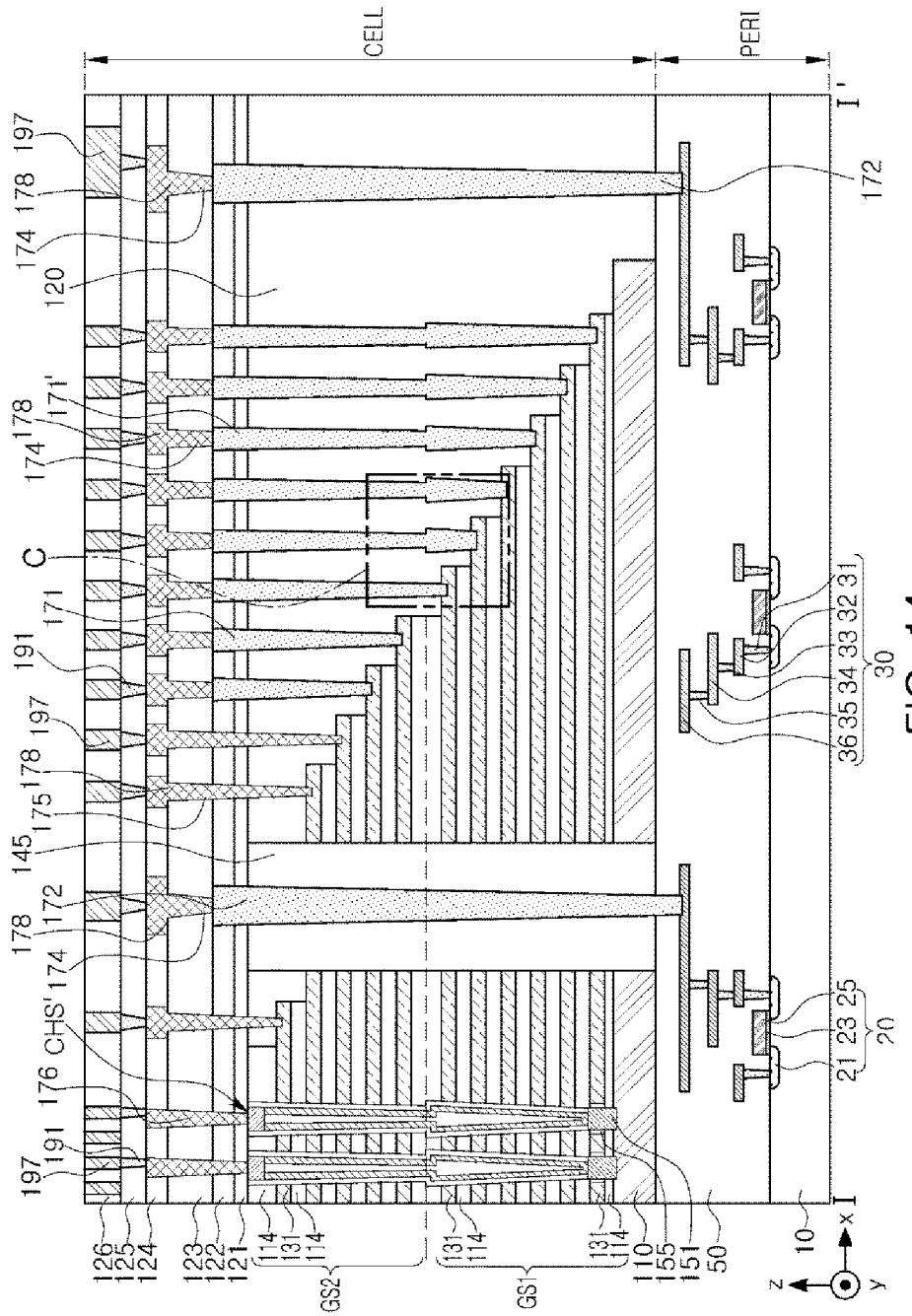
FIG. 14 is a schematic cross-sectional diagram illustrating a semiconductor device according to an example embodiment of the present inventive concept.
Figure 15:
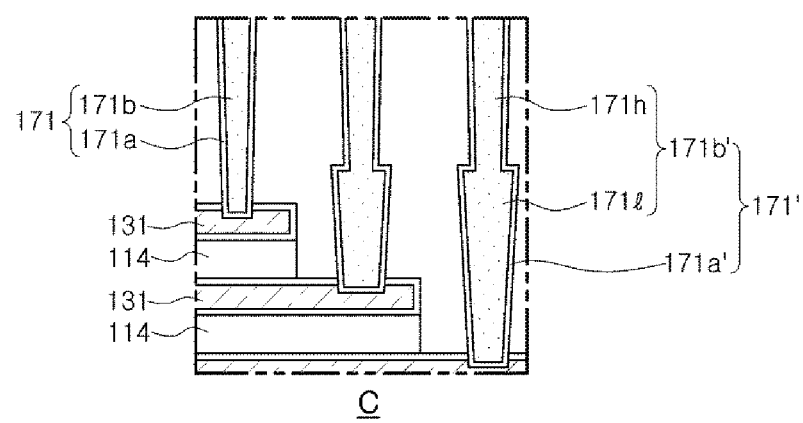
FIG. 15 is a cross-sectional diagram illustrating region "B" in FIG. 14 in magnified form.

FIG. 14 is a schematic cross-sectional diagram illustrating a semiconductor device according to an example embodiment. FIG. 15 is a cross-sectional diagram illustrating region "B" in FIG. 14 in magnified form. The semiconductor device in FIGS. 14 and 15 may be similar to the semiconductor device in FIG. 13, but shapes of some of first gate contact plugs 171' may be different.

Some of the first gate contact plugs 171' contacting gate electrode layers 131 in a first gate stack structure GS1 may include a region having a width decreasing towards an upper substrate 110, which width then abruptly increases. Some of the first gate contact plugs 171' contacting the gate electrode layers 131 in the first gate stack structure GS1 may have a width decreasing toward the upper substrate which abruptly increases at a boundary between the first gate stack structure GS1 and the second gate stack structure GS2, and decreases again.

Referring to FIG. 15, the first gate contact plugs 171' may include a first gate contact barrier layer 171a' and a first gate contact conductive layer 171b', and a bottom surface and a side surface of the first gate contact conductive layer 171b' may be encapsulated by the first gate contact barrier layer 171a'. The first gate contact conductive layer 171b' may include a lower gate contact conductive layer 171l and an upper gate contact conductive layer 171h. A boundary between the lower gate contact conductive layer 171l and the upper gate contact conductive layer 171h may be the same as a boundary between a first gate stack structure GS1 and a second gate stack structure GS2. The upper gate contact conductive layer 171h may have a width decreasing toward the upper substrate 110, and the lower gate contact conductive layer 171l may have a width also decreasing toward the upper substrate 110. A width of a lower portion of the upper gate contact conductive layer 171h may be greater than a width of an upper portion of the lower gate contact conductive layer 171l.

FIGS. 16 to 20 are schematic cross-sectional diagrams illustrating a method of manufacturing a semiconductor device according to an example embodiment. In FIGS. 16 to 20, a region corresponding to FIG. 4 is illustrated.

Figure 16:
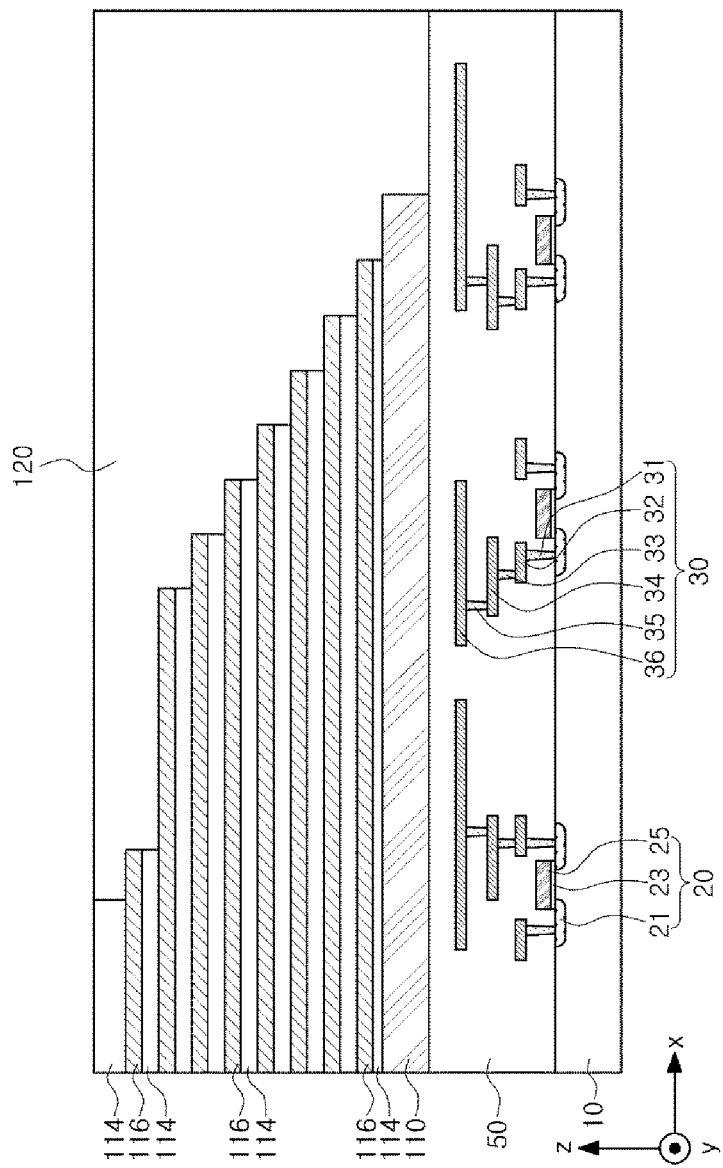
FIGS. 16 to 20 are schematic cross-sectional diagrams illustrating a method of manufacturing a semiconductor device according to an example embodiment of the present inventive concept.

Referring to FIG. 16, circuit devices 20 and lower wiring structures 30 may be disposed on an upper substrate 10.

A circuit gate dielectric layer 23 and a circuit gate electrode layer 25 may be formed on a lower substrate 10. Thereafter, source/drain regions 21 may be formed on both side portions of the circuit gate electrode layer 25.

The lower wiring structures 30 and a lower interlayer insulating layer 50 may be formed on the lower substrate 10. The lower wiring structures 30 may include a first lower contact plug 31, a first lower wiring line 32, a second lower contact plug 33, and a second lower wiring line 34, and a third lower contact plug 35, and a third lower wiring line 36. The lower interlayer insulating layer 50 may be formed of a plurality of insulating layers.

An upper substrate 110 may be formed on the lower interlayer insulating layer 50. The upper substrate 110 may be formed of polycrystalline silicon, for example. The upper substrate 110 may include, for example, p-type impurities. The upper substrate 110 may have a size smaller than a size of the lower substrate 10.

Mold insulating layers 114 and sacrificial layers 116 may be alternately stacked on the upper substrate 110, and the sacrificial layers 116 and the mold insulating layers 114 may be partially removed by repeatedly performing a photolithography process and an etching process to extend the sacrificial layers 116 and the mold insulating layers 114 by different lengths in an X direction. Accordingly, the sacrificial layers 116 and the mold insulating layers 114 may form a staircase structure.

The sacrificial layers 116 may be replaced with gate electrode layers 131 through a subsequent process. The sacrificial layers 116 may be formed of a material that has etch selectivity in relation to a material formed of the mold insulating layers 114. For example, the mold insulating layers 114 may be formed of at least one material from among silicon oxide and silicon nitride, and the sacrificial layers 116 may be formed of a material from among silicon, silicon oxide, silicon carbide, and silicon nitride, and a material of the sacrificial layers 116 may be different from the selected material of the mold insulating layers 114. Some of the mold insulating layers 114 may have thicknesses different from thicknesses of the other mold insulating layers 114.

Thereafter, a first upper interlayer insulating layer 120 covering a stack structure of the sacrificial layers 116 and the mold insulating layers 114 and the upper substrate 110 may be formed. A top surface of the first upper interlayer insulating layer 120 may be coplanar with a top surface of an uppermost mold insulating layer 114 through a planarization process.

Figure 17:
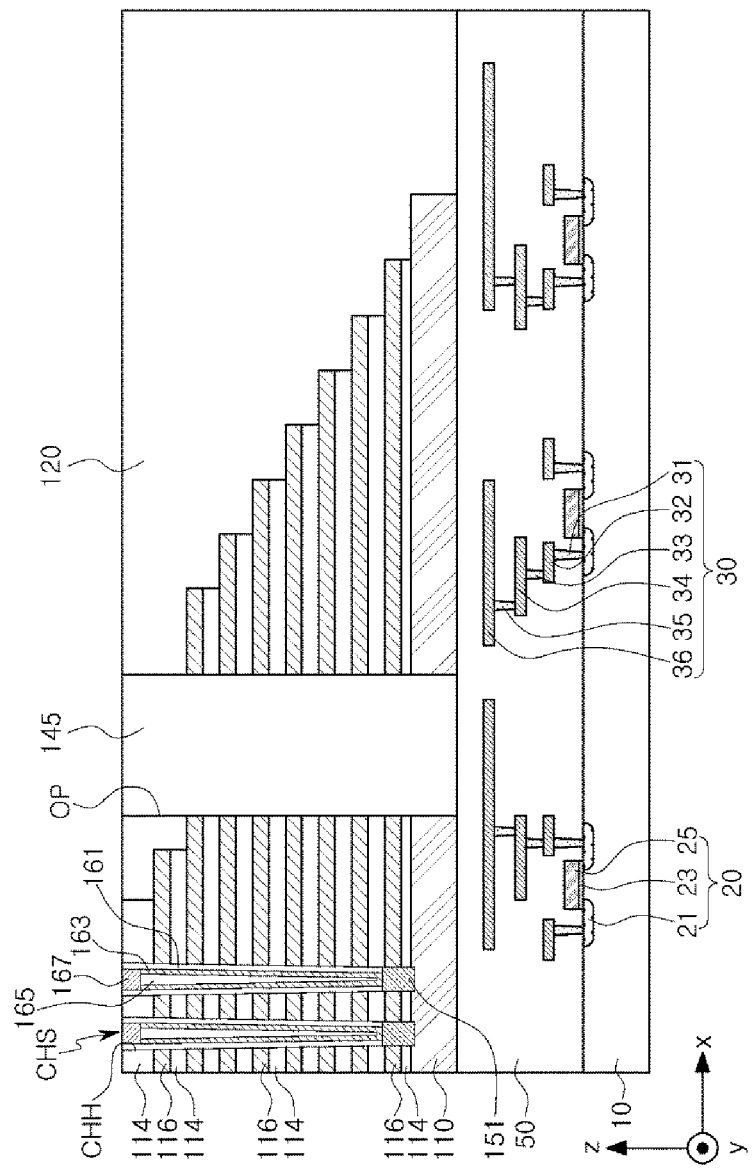

Referring to FIG. 17, a through region 145 penetrating through a stack structure of sacrificial layers 116 and mold insulating layers 114 and an upper substrate 110 may be formed.

An opening OP penetrating through the stack structure of the sacrificial layers 116 and the mold insulating layers 114 and exposing a lower interlayer insulating layer 50 may be formed by an anisotropic etching process, and the through region 145 may be formed by filling the opening OP with an insulating material. A top surface of the through region 145 may be coplanar with a top surface of a first upper interlayer insulating layer 120.

Channel holes CHH penetrating through the stack structure of the sacrificial layers 116 and the mold insulating layers 114 and exposing the upper substrate 110 may be formed. The channel holes CHH may have a hole shape having a high aspect ratio, and may be formed by an anisotropic etching process. Due to a height of the stack structure, side walls of the channel holes CHH may not be perpendicular to a top surface of the upper substrate 110.

Channel structures CHS may be formed by forming an epitaxial layer 151, a gate dielectric layer 161, a channel region 163, a channel insulating layer 165, and a channel pad 167 in the channel holes CHH. The epitaxial layer 151 may be formed using a selective epitaxial growth (SEG) process. The epitaxial layer 151 may be formed of a single layer or a plurality of layers. The epitaxial layer 151 may include polycrystalline silicon, single crystal silicon, polycrystalline germanium, or single crystal germanium, in which impurities are doped or not doped. The gate dielectric layers 161 may have equal thicknesses through an ALD process or a CVD process. The channel region 163 may be formed on the gate dielectric layer 161 in the channel holes CHH, and a lower portion of the channel region 163 may penetrate through the gate dielectric layer 161 and may be connected to the epitaxial layer 151. The channel insulating layer 165 may fill an internal space of the channel area 163, and may be formed of an insulating material. Depending on example embodiments, the internal space of the channel area 163 may be filled with a conductive material, rather than the channel insulating layer 165. A channel pad 167 may be formed of a conductive material, such as doped polycrystalline silicon, for example.

Figure 18:
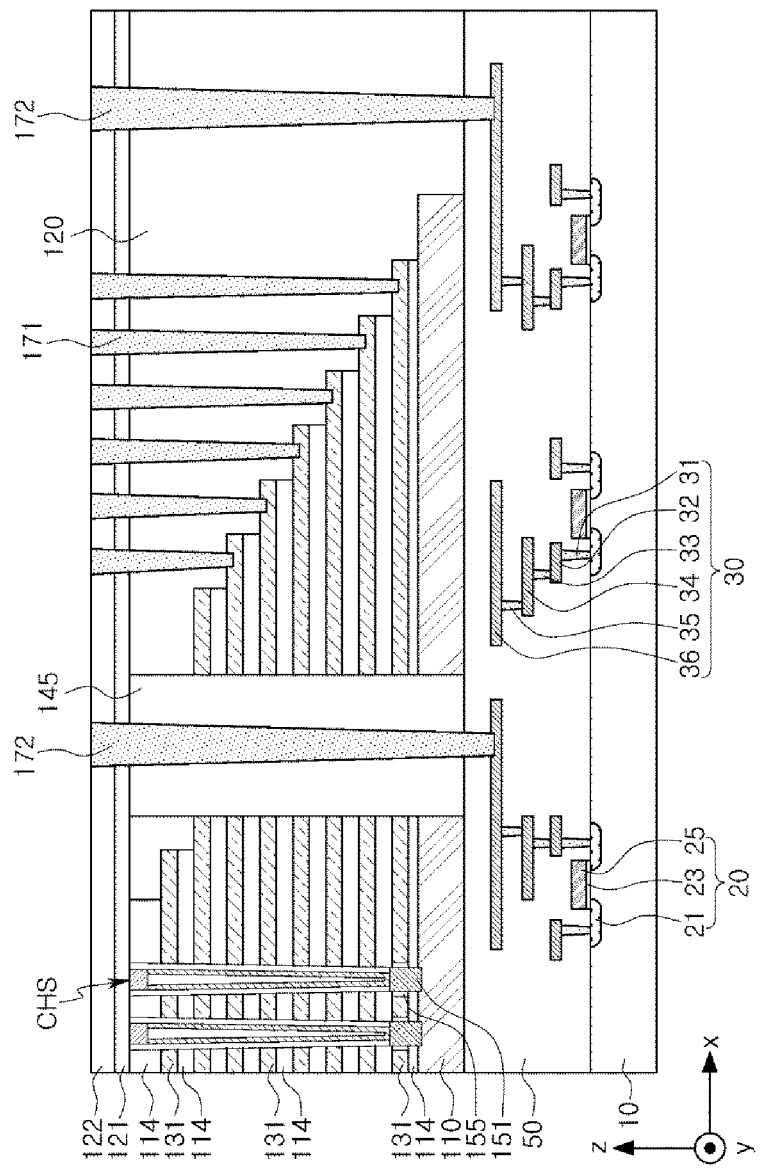

Referring to FIG. 18, openings dividing a stack structure of mold insulating layers 114 and sacrificial layers 116 into a plurality of regions may be formed, and only the sacrificial layers 116 exposed through the openings may be removed by a wet etching process. The space in which the sacrificial layers 116 are removed may be filled with a conductive material to form gate electrode layers 131. Before filing the space in which the sacrificial layers 116 are removed with a conductive material, an oxidation process may be undertaken to form an epi-insulating layer 155 on a side wall of an epitaxial layer 151.

Before forming the openings, a second upper interlayer insulating layer 121 covering the mold insulating layers 114, channel structures CHS, a through region 145, and a first upper interlayer insulating layer 120 may be formed.

Although not illustrated, a common source region 108 may be formed by injecting impurities into an upper substrate 110 exposed through the opening, and an insulating layer 182 and a conductive layer 180 may be formed in the opening (see FIG. 8).

A third upper interlayer insulating layer 122 covering the second upper interlayer insulating layer 121 may be formed, and first gate contact plugs 171 connected to the gate electrode layers 131 other than the gate electrode layers 131 disposed in an upper portion among the plurality of gate electrode layers 131 may be formed. The gate electrode layers 131 disposed in an upper portion among the plurality of gate electrode layers 131 may be referred to as upper gate electrode layers 131, and the other gate electrode layers 131 may be referred to as lower gate electrode layers 131.

First gate contact holes penetrating through the first to third upper interlayer insulating layers 120, 121, and 122 and exposing the lower gate electrode layers 131 may be formed through an anisotropic etching process. The first gate contact plugs 171 may be formed by forming barrier layers in the first gate contact holes and filling the first gate contact holes with a conductive layer. Through plugs 172 penetrating through the through region 145, and the second and third upper interlayer insulating layers 121 and 122 or penetrating the first to third upper interlayer insulating layers 120, 121, and 122 and connected to a lower wiring structure 30 may be formed. The through plugs 172 may include conductive layers, and barrier layers covering bottom surfaces and side surfaces of the conductive layers.

When the gate contact holes having different depths, which expose pad regions P of the plurality of gate electrode layers 131, are etched, a punching defect in which some of the gate contact holes penetrate through the pad regions may occur. The higher the number of layers of the plurality of gate electrode layers 131, the more difficult it may be to prevent a punching defect by simply improving an etch selectivity of an anisotropic etching process for forming the gate contact holes.

In an example embodiments, by forming the contact holes exposing the pad regions P of the gate electrode layers 131 other than the gate electrode layers 131 disposed in an upper portion among the plurality of gate electrode layers 131, a punching defect in which the contact holes penetrate through the gate electrode layers 131 may be prevented.

Figure 19:
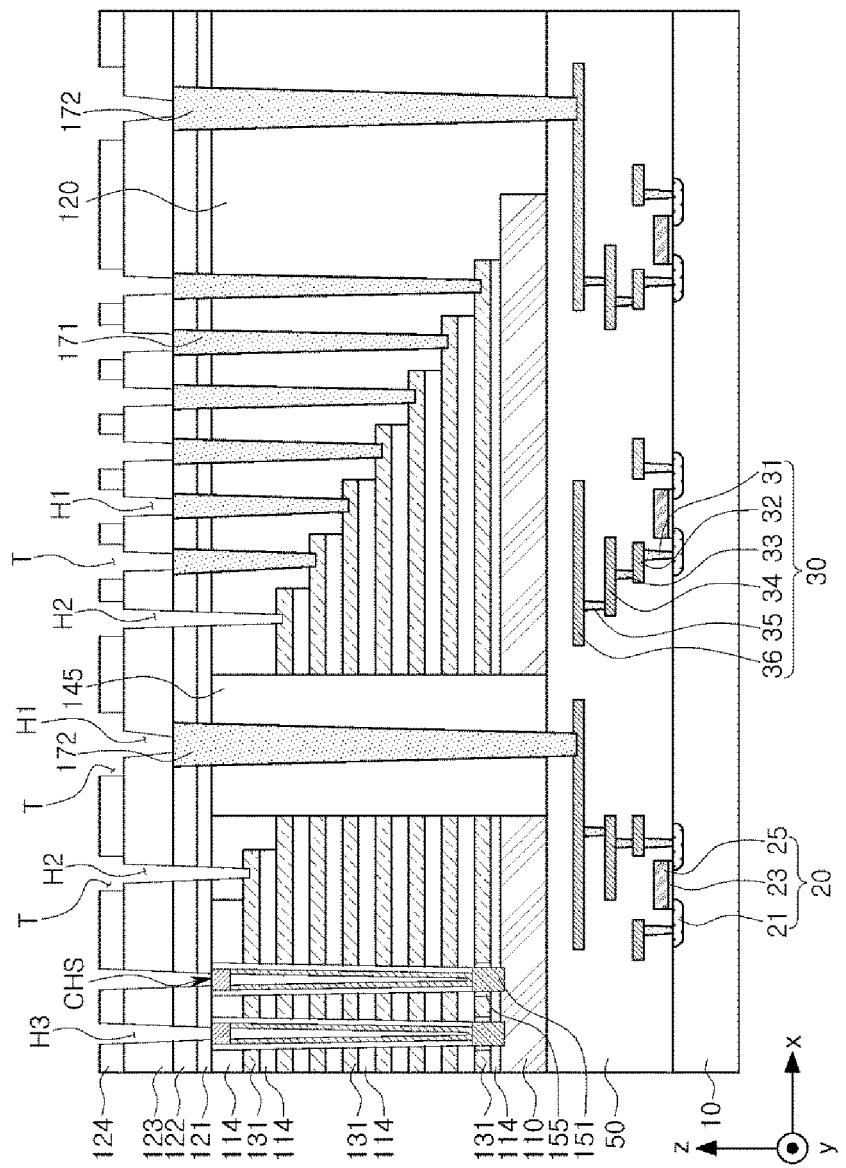

Referring to FIG. 19, fourth and fifth upper interlayer insulating layers 123 and 124 may be formed on a third upper interlayer insulating layer 122. First contact holes H1, second contact holes H2, third contact holes H3 may be formed through an anisotropic etching process. The first contact holes H1 may penetrate through the fourth and fifth upper interlayer insulating layers 123 and 124 and expose first gate contact plugs 171 and through plugs 172. The second contact holes H2 may penetrate through the first to fifth upper interlayer insulating layers 120, 121, 122, 123, and 124 and expose upper gate electrode layers 131. The second contact holes H2 may be second gate contact holes. The third contact holes H3 may penetrate through the second to fifth upper interlayer insulating layers 121, 122, 123, and 124 and expose channel structures CHS. Wiring trenches T may be formed by an additional anisotropic etching process. The wiring trenches T may be formed in a location of overlap between the fifth upper interlayer insulating layer 124 and the first and second contact holes H1 and H2 by etching the fifth upper interlayer insulating layer 124. The wiring trenches T may be connected to the first and second contact holes H1 and H2 disposed below the wiring trenches T.

Figure 20:
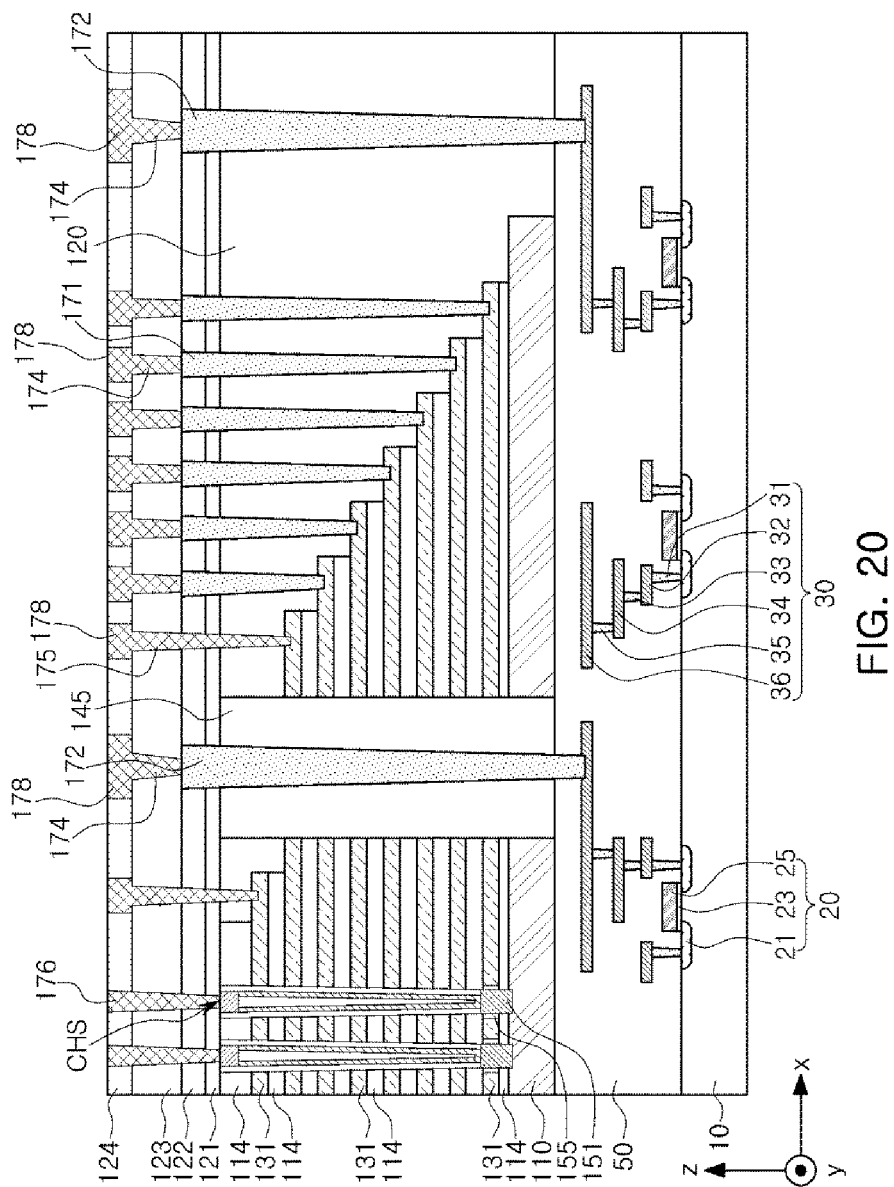

Referring to FIG. 20, first contact studs 174, second gate contact plugs 175, channel contact studs 176, and first upper wirings 178 may be formed by forming barrier layers in wiring trenches T, first contact holes H1, second contact holes H2, and third contact holes H3, and filling the wiring trenches T, the first contact holes H1, the second contact holes H2, and the third contact holes H3 with a conductive layer through a dual damascene process.

The first upper wirings 178 may respectively be disposed on the first contact studs 174 and the second gate contact plugs 175. Some of the first upper wirings 178 may respectively be integrated with the first contact studs 174. The other first upper wirings 178 may be respectively integrated with the second gate contact plugs 175. Though not shown, the wirings may extend in the Y direction and may connect to other wirings or conductive lines.

It should be noted that although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

According to the aforementioned example embodiments, by replacing some of the gate contact plugs connected to the gate electrode layers with the contact studs formed on the gate contact plugs in the memory cell region, a vertical-type memory device in which a punching defect is resolved may be provided.

While the example embodiments have been shown and described above, it will be apparent to those skilled in the art that modifications and variations could be made without departing from the scope of the present invention as defined by the appended claims.

What is claimed is:

1. A vertical-type memory device, comprising:
a plurality of gate electrode layers spaced apart from one another and stacked on a substrate, and extending by different lengths in a first direction and forming a staircase structure;
a first interlayer insulating layer covering the staircase structure of the plurality of gate electrode layers; and
a plurality of gate contact plugs penetrating the first interlayer insulating layer and respectively contacting the gate electrode layers,
wherein the plurality of gate electrode layers comprise lower gate electrode layers disposed adjacently to the substrate, and upper gate electrode layers disposed on the lower gate electrode layers so that the lower gate electrode layers are between the substrate and the upper gate electrode layers,
wherein the plurality of gate contact plugs comprise lower gate contact plugs connected to the lower gate electrode layers, and upper gate contact plugs connected to the upper gate electrode layers,
wherein the upper gate contact plugs have top-most portions disposed at a height higher than a height of top surfaces of the lower gate contact plugs,
wherein the lower gate contact plugs are each integrally formed of a continuous material to extend from a respective lower gate electrode layer to a height above a top surface of the first interlayer insulating layer, and
wherein the upper gate contact plugs are each integrally formed of a continuous material to extend from a respective upper gate electrode layer to a height above a top surface of the first interlayer insulating layer.

2. The vertical-type memory device of claim 1, further comprising:
a plurality of contact studs respectively disposed on the lower gate contact plugs,
wherein the top-most portions of the upper gate contact plugs are disposed at the same height as a height of top-most portions of the plurality of contact studs.

3. The vertical-type memory device of claim 2, further comprising:
first metal wires respectively disposed on and directly connected to the upper gate contact plugs and second metal wires respectively disposed on and directly connected to the plurality of contact studs.

4. The vertical-type memory device of claim 3, wherein the first metal wires are respectively integrated with the upper gate contact plugs.

5. The vertical-type memory device of claim 1, wherein the plurality of gate electrode layers forming the staircase structure have ends including pad regions having thicknesses greater than thicknesses of the other regions of the plurality of gate electrode layers, and the plurality of gate contact plugs contact the pad regions.

6. The vertical-type memory device of claim 1, further comprising:
a lower wiring structure disposed below the substrate; and
through plugs penetrating through the plurality of gate electrode layers and contacting the lower wiring structure,
wherein the top-most portions of the upper gate contact plugs are disposed at a height higher than a height of top surfaces of the through plugs.

7. The vertical-type memory device of claim 1, further comprising:
a plurality of channel structures penetrating through the plurality of gate electrode layers; and
a plurality of dummy structures penetrating through at least one of the plurality of gate electrode layers, and disposed adjacently to the plurality of gate contact plugs.

8. The vertical-type memory device of claim 7, wherein the plurality of dummy structures have the same structure as a structure of the plurality of channel structures, and are electrically connected to the substrate.

9. The vertical-type memory device of claim 7, wherein the plurality of channel structures have a structure different from a structure of the plurality of dummy structures, the plurality of channel structures are electrically connected to the substrate, and the plurality of dummy structures are insulated from the substrate.

10. A vertical-type memory device, comprising:
a memory cell region comprising a plurality of gate electrode layers spaced apart from one another and vertically stacked on a substrate, and a plurality of gate contact plugs respectively contacting the plurality of gate electrode layers,
wherein the plurality of gate contact plugs comprise a first gate contact plug contacting a lowermost gate electrode layer among the plurality of gate electrode layers, a second gate contact plug contacting a next lowermost gate electrode layer among the plurality of gate electrode layers, and a third gate contact plug contacting an uppermost gate electrode layer among the plurality of gate electrode layers, and the first gate contact plug has a top surface having a first height the same as that of the second gate contact plug and lower than a second height of a top-most portion of the third gate contact plug,
wherein:
the first gate contact plug is integrally formed of a continuous material to extend from the lowermost gate electrode layer to a height above the uppermost gate electrode layer,
the second gate contact plug is integrally formed of a continuous material to extend from the next lowermost gate electrode layer to a height above the uppermost gate electrode layer, and
the third gate contact plug is integrally formed of a continuous material to extend from the uppermost gate electrode layer to the second height.

11. The vertical-type memory device of claim 10, further comprising:
a peripheral circuit region comprising circuit devices and lower wiring structures disposed on a lower substrate below the substrate, wherein the memory cell region is disposed on the peripheral circuit region.

12. The vertical-type memory device of claim 10, wherein the plurality of gate electrode layers extend by different lengths in a first direction and form a staircase structure, and further comprising:
a first interlayer insulating layer covering the staircase structure of the plurality of gate electrode layers, wherein
the first gate contact plug penetrates the first interlayer insulating layer to contact the lowermost gate electrode layer, and
the third gate contact plug penetrates the first interlayer insulating layer to contact the uppermost gate electrode layer.

13. The vertical-type memory device of claim 10, further comprising:
- a through region penetrating through the substrate and the plurality of gate electrode layers; and
- a through plug penetrating through the through region and connected to a lower wiring structure disposed on a lower substrate below the substrate,
- wherein the through plug has a top surface having a height lower than the second height.

14. The vertical-type memory device of claim 10, wherein the memory cell region further comprises a contact stud disposed on the first gate contact plug, and the top-most portion of the third gate contact plug is disposed at the same height as a height of a top surface of the contact stud.

15. The vertical-type memory device of claim 10, wherein the plurality of gate electrode layers include pad regions and other regions, the pad regions having thicknesses greater than thicknesses of the other regions, and for each gate electrode layer including the lowermost gate electrode layer and uppermost gate electrode layer, a respective gate contact plug contacts a respective pad region.

16. The vertical-type memory device of claim 10, further comprising:
- a plurality of working channel structures penetrating through the plurality of gate electrode layers; and
- a plurality of dummy channel structures penetrating through at least one of the plurality of gate electrode layers.

17. The vertical-type memory device of claim 16, wherein the plurality of working channel structures have structures different from the plurality of dummy channel structures, the plurality of working channel structures are electrically connected to the substrate, and the plurality of dummy channel structures are insulated from the substrate.

18. The vertical-type memory device of claim 16, wherein the first gate contact plug comprises a region having a width decreasing towards the substrate, which width then increases.

19. A vertical-type memory device, comprising:
- a lower substrate;
- circuit devices provided on the lower substrate;
- a lower interlayer insulating layer covering the circuit devices;
- an upper substrate disposed on the lower interlayer insulating layer;
- a first gate electrode layer and a second gate electrode layer spaced apart from each other and stacked on the upper substrate;
- an upper interlayer insulating layer covering the first gate electrode layer and the second gate electrode layer;
- a first gate contact plug and a second gate contact plug penetrating through the upper interlayer insulating layer and respectively contacting the first gate electrode layer and the second gate electrode layer; and
- a through plug penetrating through the first and second gate electrode layers and the upper substrate and electrically connected to the circuit devices,
- wherein the first gate contact plug and the through plug have top surfaces having heights lower than a height of a top-most portion of the second gate contact plug.

* * * * *